US009466765B1

(12) United States Patent
Yoon et al.

(10) Patent No.: US 9,466,765 B1
(45) Date of Patent: Oct. 11, 2016

(54) METHOD OF MANUFACTURING SEMICONDUCTOR LIGHT EMITTING DEVICE

(71) Applicant: SAMSUNG ELECTRONICS CO., LTD., Suwon-si (KR)

(72) Inventors: Ju Heon Yoon, Seoul (KR); Yeon Ji Kim, Suwon-si (KR); Yong Seok Kim, Seoul (KR); Tae Kang Kim, Yongin-si (KR); Tae Hun Kim, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/056,124

(22) Filed: Feb. 29, 2016

(30) Foreign Application Priority Data

May 27, 2015  (KR) .................. 10-2015-0073728

(51) Int. Cl.
*H01L 33/62* (2010.01)
*H01L 33/36* (2010.01)
*H01L 33/44* (2010.01)
*H01L 21/02* (2006.01)
*H01L 33/22* (2010.01)
*H01L 33/40* (2010.01)
*H01L 33/00* (2010.01)

(52) U.S. Cl.
CPC ......... *H01L 33/22* (2013.01); *H01L 21/02068* (2013.01); *H01L 33/0075* (2013.01); *H01L 33/40* (2013.01); *H01L 33/44* (2013.01); *H01L 33/62* (2013.01); *H01L 33/0095* (2013.01); *H01L 2933/0016* (2013.01); *H01L 2933/0025* (2013.01); *H01L 2933/0066* (2013.01)

(58) Field of Classification Search
CPC ... H01L 21/02068–21/02071; H01L 21/0234; H01L 33/0075; H01L 33/0062; H01L 33/40; H01L 33/44; H01L 33/22; H01L 33/36; H01L 33/62; H01L 2933/0016; H01L 2933/0025

See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |

(Continued)

FOREIGN PATENT DOCUMENTS

| JP | 2014-179586 A | 9/2014 |
| KR | 10-1115533 B1 | 3/2012 |

(Continued)

*Primary Examiner* — Marvin Payen
*Assistant Examiner* — Jeremy Joy
(74) *Attorney, Agent, or Firm* — Sughrue Mion, PLLC

(57) ABSTRACT

A method of manufacturing a semiconductor light emitting device includes stacking a light emitting structure including a first conductivity type semiconductor layer, an active layer, and a second conductivity type semiconductor layer on a substrate; forming a first electrode and a second electrode on the first conductivity type semiconductor layer and the second conductivity type semiconductor layer, respectively; forming an insulating layer covering the first and second electrodes and having first and second openings partially exposing surfaces of the first and second electrodes, respectively; and performing a plasma treatment on a surface of the insulating layer and the partially exposed surfaces of the first and second electrodes to form an unevenness portion on the surface of the insulating layer and form an oxygen-depleted layer on the partially exposed surfaces of the first and second electrodes.

19 Claims, 21 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,687,821 B2 | 3/2010 | Jeon et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,846,755 B2 * | 12/2010 | Kal .................. H01L 27/153 257/97 |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,624,287 B2 | 1/2014 | Lee et al. |
| 8,735,931 B2 | 5/2014 | Han et al. |
| 8,766,295 B2 | 7/2014 | Kim |
| 2003/0222270 A1 | 12/2003 | Uemura |
| 2004/0198046 A1 * | 10/2004 | Yu-Chou .......... H01L 21/02071 438/689 |
| 2004/0212030 A1 * | 10/2004 | Asai .................. G02B 6/12002 257/432 |
| 2004/0246432 A1 * | 12/2004 | Tsuchiya ............ H01L 27/3246 349/187 |
| 2005/0167832 A1 * | 8/2005 | Kainou ............... H01L 23/3114 257/738 |
| 2009/0001407 A1 | 1/2009 | Osawa et al. |
| 2011/0281432 A1 | 11/2011 | Farooq et al. |
| 2013/0099272 A1 | 4/2013 | von Malm |
| 2013/0334552 A1 * | 12/2013 | Yang .................... H01L 33/382 257/98 |
| 2014/0070227 A1 * | 3/2014 | Totani .................... H01L 33/42 257/76 |
| 2014/0138729 A1 | 5/2014 | Kim et al. |
| 2014/0209955 A1 * | 7/2014 | Kim ...................... H01L 33/62 257/99 |
| 2014/0312369 A1 * | 10/2014 | Yoon .................... H01L 33/382 257/96 |
| 2014/0345681 A1 * | 11/2014 | Yoshida ............... H01L 31/0687 136/255 |
| 2015/0207051 A1 * | 7/2015 | Yoon ...................... H01L 33/14 362/382 |
| 2016/0056118 A1 * | 2/2016 | Yoon ...................... H01L 24/16 257/99 |

FOREIGN PATENT DOCUMENTS

| | | |
|---|---|---|
| KR | 10-1239857 B1 | 3/2013 |
| KR | 10-1259992 B1 | 5/2013 |
| KR | 10-1350923 B1 | 1/2014 |

* cited by examiner

METHOD OF MANUFACTURING SEMICONDUCTOR LIGHT EMITTING DEVICE

CROSS-REFERENCE TO RELATED APPLICATION

This application claims priority from Korean Patent Application No. 10-2015-0073728 filed on May 27, 2015, in the Korean Intellectual Property Office, the disclosure of which is incorporated herein by reference in its entirety.

TECHNICAL FIELD

Methods consistent with the example embodiments relate to manufacturing a semiconductor light emitting device.

BACKGROUND

Semiconductor light emitting devices such as light emitting diodes (LEDs) may convert energy generated due to the recombination of electrons and electron holes into light to be emitted from the semiconductor light emitting devices. LEDs are currently in widespread use in lighting elements, display devices and light sources, and the development thereof has accordingly been accelerated.

In particular, in accordance with the commercialization of devices such as cellular phone keypads, turn signal lamps, camera flashes and the like, which use gallium nitride (GaN)-based LEDs, the development and usage of which have matured, lighting devices using light emitting diodes are being actively developed. These light emitting diodes are applied to a variety of products, such as large scale TV backlight units, vehicle headlamps, general lighting devices and the like, and the use of the light emitting diode has progressed to large scale products having high outputs and high efficiency and has been gradually broadened.

Accordingly, there is a need for a method of reducing manufacturing costs and decreasing manufacturing times in order to allow for the mass production of semiconductor light emitting devices.

SUMMARY

An aspect of the example embodiments may provide a method of reducing manufacturing costs and decreasing manufacturing times of semiconductor light emitting devices.

According to an aspect of an example embodiment, there is provided a method of manufacturing a semiconductor light emitting device, the method including: stacking a light emitting structure including a first conductivity type semiconductor layer, an active layer, and a second conductivity type semiconductor layer on a substrate; forming a first electrode and a second electrode on the first conductivity type semiconductor layer and the second conductivity type semiconductor layer, respectively; forming an insulating layer covering the first and second electrodes and having first and second openings partially exposing surfaces of the first and second electrodes, respectively; and performing a plasma treatment on a surface of the insulating layer and the partially exposed surfaces of the first and second electrodes to form an unevenness portion on the surface of the insulating layer and form an oxygen-depleted layer on the partially exposed surfaces of the first and second electrodes.

The plasma treatment may be an Argon (Ar) plasma treatment or an $H_2$ plasma treatment.

The surface of the insulating layer may have a root mean square (RMS) roughness of at least 5 Å.

The method may further include forming an electrode pad covering a region of the insulating layer and the oxygen-depleted layer.

The forming of the electrode pad may include forming the electrode pad by stacking metal layers.

A selected metal layer among the metal layers may be formed of a material including one or more of aluminum (Al), silver (Ag), or an alloy of Al or Ag.

The method may further include providing the electrode pad such that the electrode pad contacts the oxygen-depleted layer.

The method may further include providing the selected metal layer such that the selected metal layer contacts the oxygen-depleted layer.

The method may further include providing an under bump metallurgy (UBM) layer on the electrode pad.

The insulating layer may further include a material selected from a group consisting of $SiO_2$, $SiO_xN_y$, $TiO_2$, $Al_2O_3$, $ZrO_2$ and combinations thereof.

According to an aspect of another example embodiment, there is provided a method of manufacturing a semiconductor light emitting device, the method including: stacking a light emitting structure including a first conductivity type semiconductor layer, an active layer, and a second conductivity type semiconductor layer on a substrate; forming a first electrode and a second electrode on the first conductivity type semiconductor layer and the second conductivity type semiconductor layer, respectively; forming an insulating layer covering the first and second electrodes and having first and second openings partially exposing surfaces of the first and second electrodes, respectively; and performing a plasma treatment on a surface of the insulating layer and the partially exposed surfaces of the first and second electrodes, in a single process.

The performing of the plasma treatment may include performing the plasma treatment on the surface of the insulating layer and the partially exposed surfaces of the first and second electrodes multiple times.

The performing of the plasma treatment multiple times may include performing an Ar (Argon) plasma treatment or an $H_2$ plasma treatment as a final plasma treatment among the multiple-performed plasma treatments.

The performing of the plasma treatment on the surface of the insulating layer and the partially exposed surfaces of the first and second electrodes may further include: providing a mask layer exposing the surfaces of the first and second electrodes and covering a portion of the surface of the insulating layer while performing the plasma treatment.

The method may further include using a dry etching process to form the first and second openings.

BRIEF DESCRIPTION OF DRAWINGS

The above and other aspects, features and advantages of the example embodiments will be more clearly understood from the following detailed description taken in conjunction with the accompanying drawings, in which.

DETAILED DESCRIPTION

Figure 1:
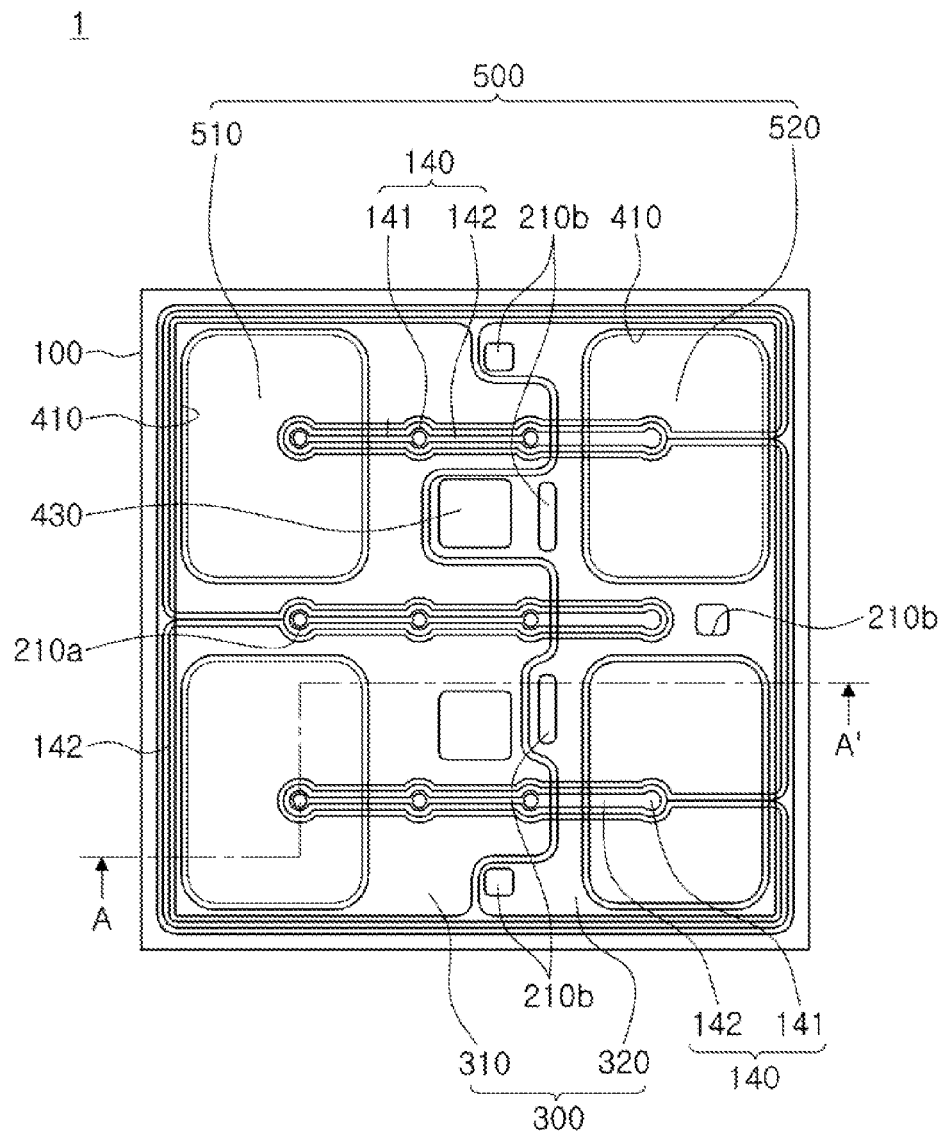
FIG. 1 is a plan view of a semiconductor light emitting device according to an example embodiment.

Various example embodiments will now be described more fully with reference to the accompanying drawings in which some example embodiments are shown. The example embodiments may, however, be embodied in many different forms and should not be construed as limited to the example embodiments set forth herein. Rather, these example embodiments are provided so that this disclosure is thorough and complete and fully conveys the example embodiments to those skilled in the art. In the drawings, the sizes and relative sizes of layers and regions may be exaggerated for clarity.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when an example embodiment can be implemented differently, functions or operations described in a particular block may occur in a different way from a flow described in the flowchart. For example, two consecutive blocks may be performed simultaneously, or the blocks may be performed in reverse according to related functions or operations.

Figure 2:
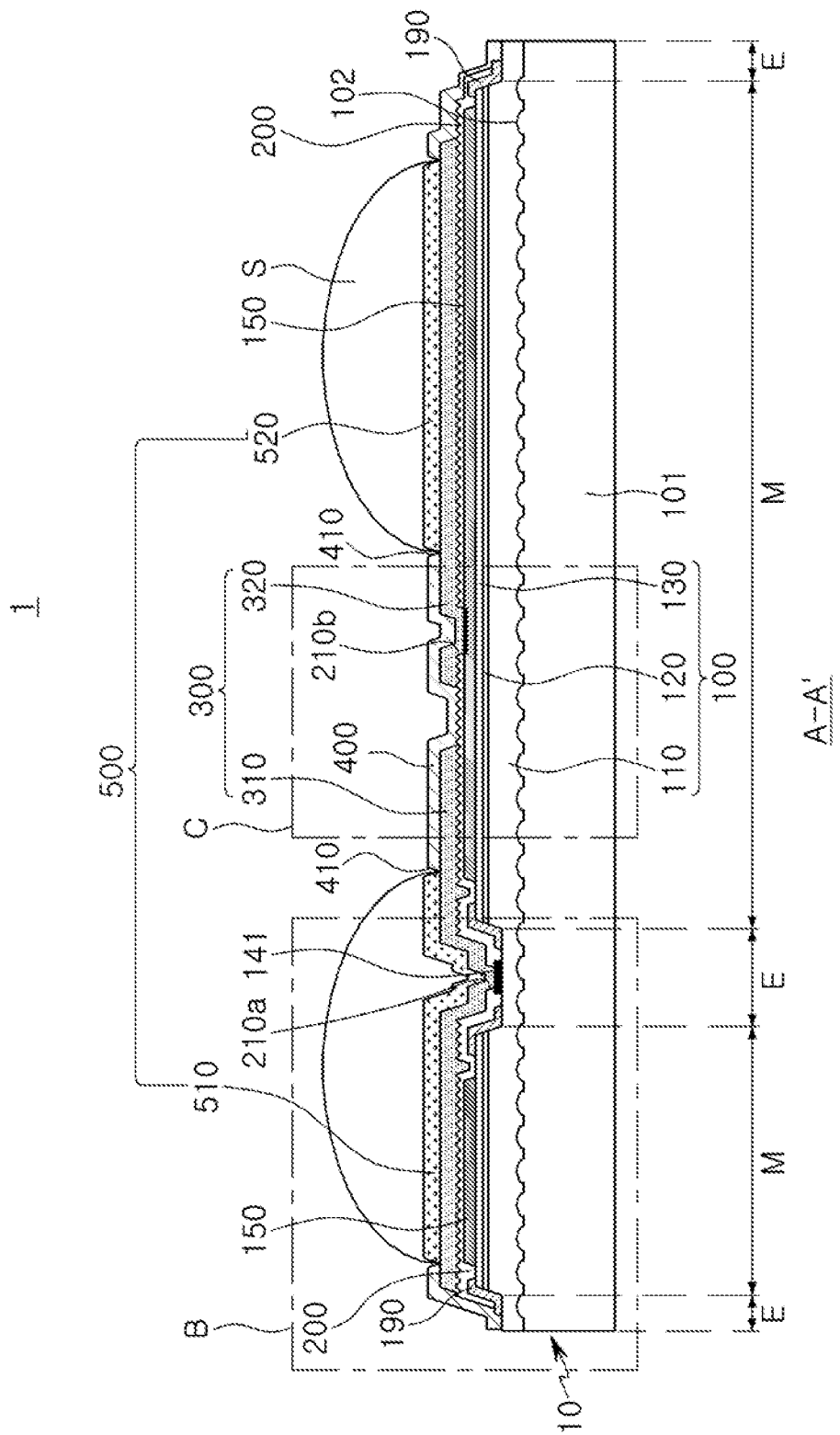
FIG. 2 is a side cross-sectional view of the semiconductor light emitting device of FIG. 1, taken along line A-A'.
Figure 3:
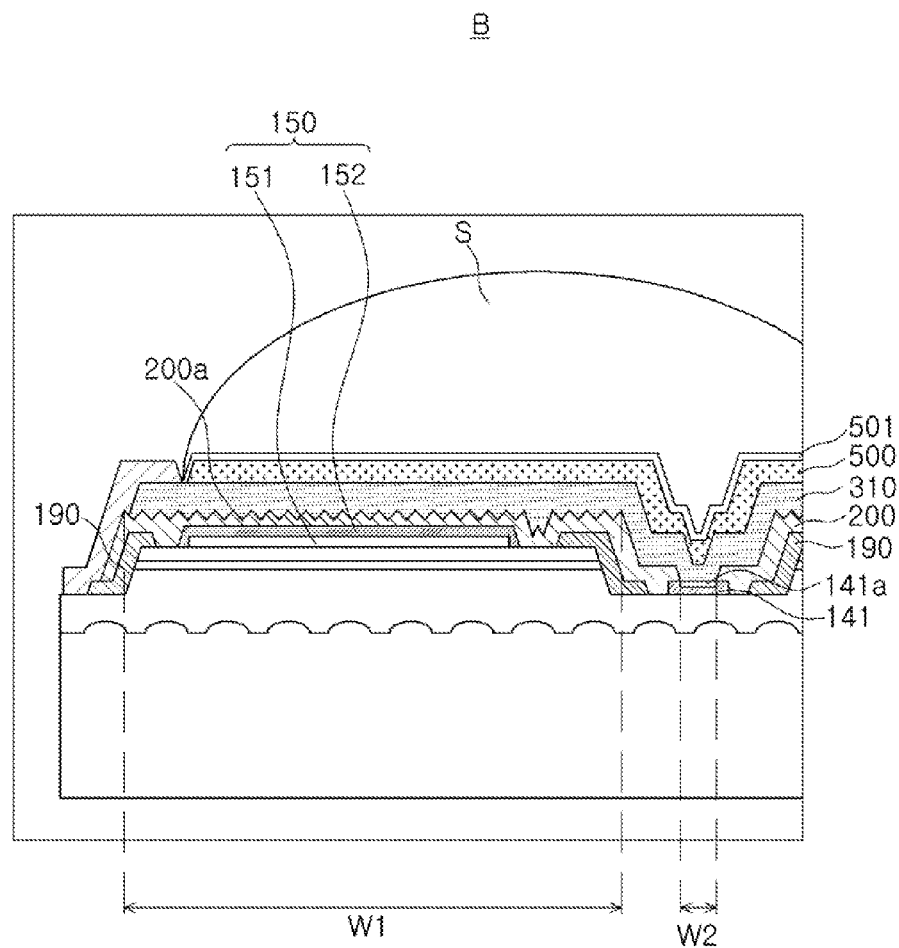
FIG. 3 is an enlarged view of portion B of FIG. 2.
Figure 4:
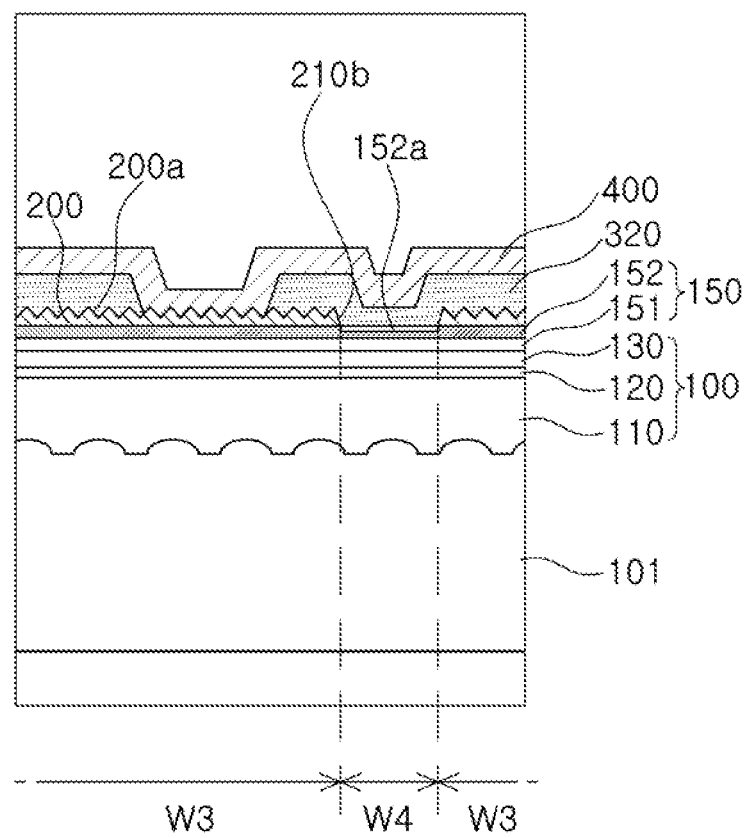
FIG. 4 is an enlarged view of portion C of FIG. 2.

With reference to FIG. 1 through FIG. 4, a semiconductor light emitting device 1 according to an example embodiment will be described. FIG. 1 is a schematic plan view of a semiconductor light emitting device according to an example embodiment. FIG. 2 is a side cross-sectional view of the semiconductor light emitting device of FIG. 1, taken along line A-A. FIG. 3 is an enlarged view of portion B of FIG. 2 and FIG. 4 is an enlarged view of portion C of FIG. 2.

Referring to FIG. 1 and FIG. 2, the semiconductor light emitting device 1 according to an example embodiment may be configured to include a light emitting diode chip 10 and first and second insulating layers 190 and 200.

The light emitting diode chip 10 may be configured to include a light emitting structure 100 and first and second electrodes 140 and 150 and may have a first surface on which the first and second electrodes 140 and 150 are disposed and a second surface opposite to the first surface.

The light emitting structure 100 may have a structure in which a plurality of semiconductor layers are stacked and may include a first conductivity type semiconductor layer 110, an active layer 120, and a second conductivity type semiconductor layer 130, sequentially disposed on a substrate 101.

The substrate 101 may have an upper surface extended in an X direction and a Y direction. The substrate 101 may be provided as a semiconductor growth substrate and may be formed of an insulating, conductive, or semiconductor material such as sapphire, Si, SiC, $MgAl_2O_4$, MgO, $LiAlO_2$, $LiGaO_2$, GaN, or the like. Sapphire widely used as a nitride semiconductor growth substrate may be a crystal having electrical insulating properties and Hexa-Rhombo R3c symmetry. The sapphire may have a lattice constant of 13.001 Å in a c-axis direction and a lattice constant of 4.758 Å in an a-axis direction and may include a C (0001) plane, an A (11-20) plane, an R (1-102) plane, and the like. In this case, among the planes, the C plane may be the plane that is used as a nitride growth substrate because the C plane facilitates the growth of a nitride film and is stable at high temperature.

In addition, as illustrated in the drawings, a plurality of unevenness structures 102 may be formed on the upper surface of the substrate 101, that is, a growth surface of the semiconductor layers. Due to the unevenness structures 102, crystalline properties and light emission efficiency of the semiconductor layers may be improved. The example embodiment exemplifies a case in which the unevenness structures 102 are formed in dome-shaped protrusions, but the shape of the unevenness structures 102 is not limited thereto. For example, the unevenness structures 102 may be formed to have various shapes such as quadrangular shapes, triangular shapes, other shapes having curves, straight lines, or combinations thereof, and the like. In addition, the unevenness structures 102 may be selectively formed and provided, and depending on example embodiments, may be omitted.

Depending on example embodiments, the substrate 101 may be removed in a later process. That is, after the substrate 101 is provided as a growth substrate for growing the first conductivity type semiconductor layer 110, the active layer 120, and the second conductivity type semiconductor layer 130 thereon, the substrate 101 may be removed through a separation process. The substrate 101 may be separated from the semiconductor layers by a method such as a laser lift-off (LLO) method, a chemical lift-off (CLO) method or the like.

A buffer layer may further be provided on the upper surface of the substrate 101. The buffer layer may be provided to alleviate lattice defects of the semiconductor layers grown on the substrate 101 and may be formed of an undoped semiconductor layer formed of a nitride or the like. The buffer layer may alleviate a difference in lattice constants between the substrate 101 formed of sapphire and the first conductivity type semiconductor layer 110 formed of GaN and stacked on the upper surface of the substrate 101 to thereby enhance crystallinity of a GaN layer. The buffer layer may be formed using undoped GaN, AlN, InGaN and the like and may be grown to have a thickness of several tens to several hundred Å at a low temperature of 500° C. to 600° C. According to an example embodiment, the term "an undoped state" indicates that a separate impurity doping process is not performed on the semiconductor layer and in this case, an inherent impurity concentration in the semiconductor layer may be contained. For example, in the case that a gallium nitride semiconductor is grown using metal organic chemical vapor deposition (MOCVD), Si and the like used as a dopant may be contained in the amount of approximately $10^{14}$ to $10^{18}/cm^3$, even though creation of the dopant is not intended. However, the buffer layer may be omitted depending on example embodiments.

The first conductivity type semiconductor layer 110 stacked on the substrate 101 may be formed of a semiconductor doped with an n-type impurity and may be an n-type nitride semiconductor layer. The second conductivity type semiconductor layer 130 may be formed of a semiconductor doped with a p-type impurity and may be a p-type nitride semiconductor layer. However, depending on example embodiments, the first and second conductivity type semiconductor layers 110 and 130 may be stacked by switching positions thereof. The first and second conductivity type semiconductor layers 110 and 130 may have a compositional formula of $Al_xIn_yGa_{(1-x-y)}N$ (where, 0≤x<1, 0≤y<1, 0≤x+y<1), and materials having such a compositional formula may be, for example, GaN, AlGaN, InGaN, AlInGaN and the like.

The active layer 120 interposed between the first and second conductivity type semiconductor layers 110 and 130 may emit light having a predetermined degree of energy due to the recombination of electrons and holes. The active layer 120 may contain a material having an energy band gap smaller than an energy band gap of the first and second conductivity type semiconductor layers 110 and 130. For example, in the case that the first and second conductivity type semiconductor layers 110 and 130 are GaN-based compound semiconductors, the active layer 120 may contain an InGaN-based compound semiconductor having an energy band gap smaller than an energy band gap of GaN. In addition, the active layer 120 may have a multiple quantum well (MQW) structure in which quantum well and quantum barrier layers are alternately stacked, for example, a structure of InGaN/GaN. However, since the structure of the active layer 120 is not limited thereto, the active layer 120 may also have a single-quantum well (SQW) structure.

The light emitting structure 100 may include an etched region E in which the second conductivity type semiconductor layer 130, the active layer 120, and the first conductivity type semiconductor layer 110 are partially etched, and a plurality of mesa regions M partially divided by the etched region E.

When viewed from the above, the etched region E may have a gap structure cut in a predetermined thickness and length from one side surface of the light emitting structure 100 having a quadrangular shape toward the other side surface thereof. In addition, a plurality of etched regions E may be arranged in parallel with each other inside a quadrangular region of the light emitting structure 100. Thus, the plurality of etched regions E may be provided to be surrounded by the mesa regions M.

The first electrode 140 may be disposed on an upper surface of the first conductivity type semiconductor layer 110 exposed to the etched region E and may be connected to the first conductivity type semiconductor layer 110, and the second electrode 150 may be disposed on an upper surface of each of the plurality of mesa regions M and may be connected to the second conductivity type semiconductor layer 130. The first and second electrodes 140 and 150 may be disposed on the first surface of the light emitting diode chip 10, on which the light emitting structure 100 is positioned. Thus, the first and second electrodes 140 and 150 may be disposed on the same surface of the light emitting diode chip 10, and the light emitting diode chip 10 may be mounted on a package body in a flip-chip manner. The first and second electrodes 140 and 150 may contain a material having high conductivity such as Au, Al, Ag and the like and may have a multilayer structure.

As illustrated in FIG. 1, the first electrode 140 may include a plurality of pad portions 141, and a plurality of finger portions 142 having widths narrower than those of the pad portions 141 and respectively extended from the plurality of pad portions 141. The first electrode 140 may be extended along the etched region E. A plurality of first electrodes 140 may be arranged at intervals such that the first electrodes 140 are uniformly distributed on the first conductivity type semiconductor layer 110. Thus, a current injected into the first conductivity type semiconductor layer 110 through the plurality of first electrodes 140 may be uniformly injected into the entirety of the first conductivity type semiconductor layer 110.

The plurality of pad portions 141 may be disposed to be spaced apart from each other, and the plurality of finger portions 142 may respectively connect the plurality of pad portions 141 to each other. The plurality of finger portions 142 may have different widths. For example, according to an example embodiment, when each of the first electrodes 140 has three finger portions 142, one of the three finger portions 142 may have a width relatively greater than that of another finger portion 142. The width of the one finger portion 142 may be adjusted in consideration of resistance of the current injected through the first electrode 140.

As illustrated in FIG. 3, an oxygen-depleted layer 141a may be disposed in a region W2 contacting a first metal layer 310 in the pad portions 141. The oxygen-depleted layer 141a may be formed by performing a surface treatment on a surface of the pad portion, using plasma. The plasma treatment may be an Ar (Argon) plasma treatment or an $H_2$ plasma treatment. The plasma treatment may be repeatedly performed. In the case that the plasma treatment is performed multiple times, an $O_2$ plasma treatment process may be included in the plasma treatment, but as a final plasma treatment process, it may be preferable to perform an Ar plasma treatment or an $H_2$ plasma treatment. The oxygen-depleted layer 141a is formed by removing oxygen through the plasma treatment, and may have effects of lowering a driving voltage of a semiconductor light emitting device by decreasing a forward voltage Vf.

This feature will be described in detail. In general, an insulating layer may be disposed on the first and second electrodes disposed on the light emitting structure and in order to expose the first and second electrodes, an opening may be formed in the insulting layer by performing dry etching, such as, for example, performing inductively coupled plasma-reactive ion etching (ICP-RIE). Through this process, exposed surfaces of the first and second electrodes may be contaminated with oxides, and thus, a degree of reflectivity may be lowered and a level of forward voltage may be increased. According to an example embodiment, the contamination on the exposed surfaces of the first and second electrodes may be removed through a plasma treatment to form the oxygen-depleted layer, whereby a low degree of contact resistance may be maintained to decrease the forward voltage. By doing so, luminance of a semiconductor light emitting device may be increased and the level of driving voltage may be lowered. Such a plasma treatment, together with a plasma process of forming an unevenness portion 200a on the second insulating layer 200 to be described later, may be performed in a single process. Thus, time required for the application of the process may be decreased, as compared to the case of forming the oxygen-depleted layer 141a and the unevenness portion 200a through separate processes.

As illustrated in FIG. 3, the second electrode 150 may include a reflective metal layer 151 and may further include a coating metal layer 152 covering the reflective metal layer 151. However, the coating metal layer 152 may be selectively provided and, depending on example embodiments, may be omitted. As illustrated in FIG. 2, the second electrode 150 may be provided to cover the upper surface of the second conductivity type semiconductor layer 130 defining the upper surface of the mesa region M.

As illustrated in FIG. 4, an oxygen-depleted layer 152a may be disposed in a region W4 of a surface of the second electrode 150, in the same manner to the first electrode 140. The oxygen-depleted layer 152a may be formed in the coating metal layer 152, and in the case of having no coating metal layer 152, the oxygen-depleted layer 152a may be formed in the reflective metal layer 151. The oxygen-depleted layer 152a of the second electrode 150 may also have the same effects as those of the oxygen-depleted layer 141a of the first electrode 140 described above, and a detailed description thereof will be omitted.

As illustrated in FIG. 2, the first insulating layer 190 formed of an insulating material may be provided on the light emitting structure 100 including side surfaces of the mesa structure M, so as to cover the active layer 120 exposed to the etched region E. For example, the first insulating layer 190 may be formed of an insulating material containing $SiO_2$, $SiO_xN_y$, $TiO_2$, $Al_2O_3$, $ZrO_2$ or the like. In addition, the first insulating layer 190 may be provided to expose the first and second electrodes 140 and 150. However, the first insulating layer 190 may be selectively provided and, depending on example embodiments, may be omitted.

The second insulating layer 200 may be provided on the light emitting structure 100 so as to entirely cover the light emitting structure 100. The second insulating layer 200 may be primarily formed of a material having insulating characteristics and may be formed of an organic or inorganic material. For example, the second insulating layer 200 may be formed of an epoxy-based insulating resin. In addition, the second insulating layer 200 may be formed to contain $SiO_2$, $SiO_xN_y$, $TiO_2$, $Al_2O_3$, $ZrO_2$ or the like.

The second insulating layer 200 may have a plurality of openings 210a and 210b disposed on the first electrode 140 and the second electrode 150, respectively. In detail, the plurality of openings 210a and 210b may include a first opening 210a and a second opening 210b provided in positions corresponding to the first electrode 140 and the second electrode 150, respectively. The first opening 210a and the second opening 210b may partially expose the first electrode 140 and the second electrode 150, respectively.

In particular, in the plurality of openings 210, the first opening 210a disposed on the first electrode 140 may expose only the pad portion 141 outwardly. Thus, the first opening 210a may be disposed on the first electrode 140 in a position corresponding to a position of the pad portion 141.

As illustrated in FIG. 3 and FIG. 4, the unevenness portion 200a may be formed on one or more regions (region W1 of FIG. 3 and region W3 of FIG. 4) of a surface of the second insulating layer 200. The unevenness portion 200a may be formed by performing a surface treatment on the second insulating layer 200, using plasma. The plasma treatment may be an Ar plasma treatment, an $H_2$ plasma treatment, or another type of plasma treatment known to those skilled in the art. The plasma treatment may be repeatedly performed. In the case that the plasma treatment is performed multiple times, an $O_2$ plasma treatment process may be included in the plasma treatment, but as a final plasma treatment process, it may be preferable to perform an Ar plasma treatment or an $H_2$ plasma treatment. The unevenness portion 200a may be formed to have a root mean square (RMS) roughness of at least 5 Å or more. When the unevenness portion 200a has a root mean square (RMS) roughness of 5 Å or less, an effect of increasing a surface area of the second insulating layer 200 may be insignificant, such that it may be difficult to expect effects of improving adhesion of an electrode pad 300. The unevenness portion 200a may be formed by disposing a mask layer covering at least a portion of the second insulating layer 200, on the surface of the second insulating layer 200, and then performing the plasma treatment. In this manner, in the case of additionally disposing the mask layer, an unevenness portion having a higher degree of surface roughness as compared to the case of only performing the plasma treatment may be formed.

The unevenness portion 200a as described above may increase an area of an interface between the second insulating layer 200 and the electrode pad 300 to be described later, thereby improving adhesion of the electrode pad 300. In addition, in accordance with an increase in adhesion of the electrode pad 300, a separate adhesive layer is unnecessary in depositing the electrode pad 300 and thus, defects in which light is absorbed into the adhesive layer may be prevented. Therefore, effects of improving luminance of a semiconductor light emitting device may be achieved according to example embodiments.

In this manner, a process of forming the unevenness portion 200a on the second insulating layer 200, together with the plasma process of forming the oxygen-depleted layers 141a and 152a in the first and second electrodes 140 and 150, respectively, may be performed in a single process. Thus, time required for the application of the process may be decreased, as compared to the case of forming the oxygen-depleted layer 141a and the unevenness portion 200a through separate processes.

As illustrated in FIG. 2, the electrode pad 300 may be provided on the second insulating layer 200 and may be electrically connected to the first conductivity type semiconductor layer 110 and the second conductivity type semiconductor layer 130 through the plurality of openings 210a and 210b.

The electrode pad 300 may be insulated from the first and second conductivity type semiconductor layers 110 and 130 by the second insulating layer 200 entirely covering an upper surface of the light emitting structure 100, and may be connected to the first and second electrodes 140 and 150 partially exposed through the plurality of openings 210a and 210b to be electrically connected to the first and second conductivity type semiconductor layers 110 and 130.

The electrical connection between the electrode pad 300 and the first and second conductivity type semiconductor layers 110 and 130 may be variously adjusted by the plurality of openings 210a and 210b provided in the second insulating layer 200. For example, depending on the number and arrangement positions of the plurality of openings 210a and 210b, the electrical connection between the electrode pad 300 and the first and second conductivity type semiconductor layers 110 and 130 may be variously modified.

As illustrated in FIG. 1, the electrode pad 300 may include a first metal layer 310 and a second metal layer 320 and may be provided as at least one pair. That is, the first metal layer 310 may be electrically connected to the first conductivity type semiconductor layer 110 through the first electrode 140 and the second metal layer 320 may be electrically connected to the second conductivity type semiconductor layer 130 through the second electrode 150. In this case, the opening 210a may be configured to expose the first electrode 140 in a position overlapping with the first metal layer 310 and the opening 210b may be configured to expose the second electrode 150 in a position overlapping with the second metal layer 320. The first and second metal layers 310 and 320 may be separated and electrically insulated from each other.

The electrode pad 300 may be formed of a material containing one or more of Au, Al, W, Pt, Si, Ir, Ag, Cu, Ni, Ti, Cr and the like, and also may be formed of alloys thereof, and may be formed to have a multilayer structure. In particular, in recent manufacturing techniques, a material such as Al or Ag has been primarily used in order to improve light reflectivity. However, such a material may be easily delaminated and separated due to poor adhesion thereof when being deposited on an insulating layer containing an oxide. In the case of the occurrence of such delamination, the electrode pad 300 may be separated from the insulating layer, such that the semiconductor light emitting device may not be operated, thereby leading to a degradation in reliability of the semiconductor light emitting device. Thus, in order to solve this problem, an electrode pad is formed after the deposition of an adhesive layer formed of a material such as Cr on an insulating layer, but such an adhesive layer may reduce light reflectivity, thereby leading to a decrease in luminance of the semiconductor light emitting device. Thus, according to an example embodiment, the unevenness portion 200a may be formed on the second insulating layer 200 to increase an area of a contact interface between the second insulating layer 200 and the electrode pad 300, thereby improving adhesion of the electrode pad 300. Thus, since a separate adhesive layer is unnecessary, defects in which light is absorbed into the adhesive layer may be prevented. Therefore, the example embodiments may achieve the beneficial effect of improving luminance of the semiconductor light emitting device.

It may be required or desired to block an electrical connection between the second metal layer 320 and the first electrode 140 on which the second metal layer 320 is disposed in a position overlapping with the first electrode 140, among the first electrodes 140. To this end, the second insulating layer 200 may not have the opening 210a exposing the pad portion 141 of the first electrode 140, in a portion thereof on which the second metal layer 320 is disposed.

In detail, as illustrated in FIG. 1, when the first electrode 140 includes four pad portions 141 and three finger portions 142, the opening 210a exposing the pad portion 141 may be provided on only three pad portions 141 disposed in positions overlapping with the first metal layer 310, and may not be provided on the remaining part of the pad portion 141 disposed in a position overlapping with the second metal layer 320. Thus, the pad portions 141 of the first electrode 140 disposed below the first metal layer 310 may be connected to the first metal layer 310 via the opening 210a, but the opening 210a may not be provided on the remaining part of the pad portion 141 disposed below the second metal layer 320, such that the remaining part of the pad portion 141 and the second metal layer 320 may be electrically insulated from each other. Consequently, through arrangement structures of the plurality of openings 210a and 210b partially exposing the first electrode 140 and the second electrode 150, respectively, the first metal layer 310 may be connected to the first electrode 140 and the second metal layer 320 may be connected to the second electrode 150.

As illustrated in FIG. 2, a passivation layer 400 may be provided on the electrode pad 300 to entirely cover and protect the electrode pad 300. In addition, the passivation layer 400 may include a bonding region 410 partially exposing the electrode pad 300.

The bonding region 410 may be provided as a plurality of bonding regions 410 to partially expose the first metal layer 310 and the second metal layer 320, respectively. In this case, a portion of the plurality of bonding regions 410 may be disposed so as not to overlap with a portion of the plurality of openings 210a and 210b of the second insulating layer 200. For example, the bonding region 410 partially exposing the second metal layer 320 among the plurality of bonding regions 410 may not overlap with the opening 210b partially exposing the second electrode 150 among the plurality of openings 210a and 210b. That is, the bonding region 410 may not be positioned above the opening 210b in a vertical direction of FIG. 2. In addition, the bonding region 410 partially exposing the first metal layer 310 may partially overlap with the opening 210a partially exposing the first electrode 140.

The example embodiment described above exemplifies a case in which four bonding regions 410 are provided and arranged to be symmetrical with respect to one another, but the example embodiments are not limited thereto. The number and arrangement of the bonding regions 410 may be variously modified.

The passivation layer 400 may be formed of a material which is the same material as that of the second insulating layer 200, although is not limited thereto.

The passivation layer 400 may further include open regions 430 partially exposing the first and second metal layers 310 and 320, similar to the bonding regions 410. The open regions 430 may be provided as regions connected to a probe pin so as to confirm whether or not an operation of a semiconductor light emitting device is performed prior to the mounting of the semiconductor light emitting device.

Solder pads 500 may be respectively disposed within the bonding regions 410. The solder pads 500 may include a first solder pad 510 and a second solder pad 520 and may be respectively connected to the first and second metal layers 310 and 320 partially exposed through the bonding regions 410. In addition, the first solder pad 510 and the second solder pad 520 may be electrically connected to the first conductivity type semiconductor layer 110 and the second conductivity type semiconductor layer 130 through the first metal layer 310 and the second metal layer 320, respectively. The solder pads 500 may be formed of a material containing one or more of Ni, Au, Cu, and the like and may also be formed of alloys thereof.

The first solder pad 510 and the second solder pad 520 may be, for example, under bump metallurgy (UBM) layers. Each of the first solder pad 510 and the second solder pad 520 may be provided singularly or in plural. The example embodiment shown in FIGS. 1 and 2 exemplifies a case in which two first solder pads 510 and two second solder pads 520 are provided, but example embodiments are not limited thereto. The number and arrangement structures of the first solder pad 510 and the second solder pad 520 may be adjusted depending on the bonding regions 410.

As illustrated in FIG. 2, a solder bump S may be disposed on each of the first and second solder pads 510 and 520 and may be used in mounting the light emitting diode chip 10 on a package substrate in a subsequent process. The solder bump S, a conductive adhesive material for mounting the light emitting diode chip 10 on the package substrate in a flip-chip manner, may be Sn solder. The Sn solder may contain a tiny amount of materials such as Ag and Gu. When the solder bump S is disposed on the solder pad 500, the materials of the solder pad 500 and the solder bump S may react with each other to form an intermetallic compound (IMC) 501 on a surface of the solder pad S contacting the solder bump S, as illustrated in FIG. 3.

Figure 12:
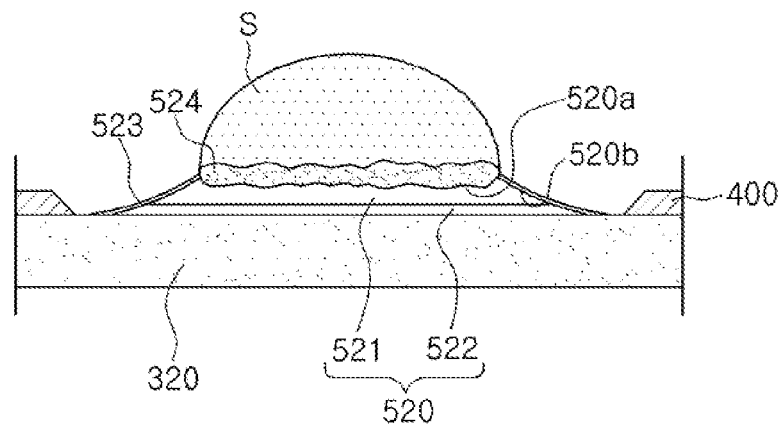
FIG. 12 is an example embodiment of a solder pad of FIG. 2.

Referring to FIG. 12, an example embodiment of the second solder pad 520 will be described. Hereinafter, only the example embodiment of the second solder pad 520 is described, but the first solder pad 510 may also be modified in the same manner.

The second solder pad 520 may enhance an interfacial bonding force between the second metal layer 320 and the solder bump S and may provide an electrical path. In addition, the second solder pad 520 may prevent solder from being diffused to the electrodes in a reflow process. That is, the permeation of components forming solder into the second solder pad 520 may be blocked.

The second solder pad 520 may be positioned on the opposite side of a surface of the second metal layer and may have a first surface 520a disposed to contact an intermetallic compound (IMC) 524 above the second metal layer 320, and a second surface 520b extended from an edge of the first surface 520a to be connected to the second metal layer 320.

The first surface 520a may have a generally flat structure and may define an upper surface of the second solder pad 520. The second surface 520b may have a structure that is smoothly inclined from the first surface 520a to the second metal layer 320 and may define a side surface of the second solder pad 520.

The second solder pad 520 may be formed of a metal material to establish an electrical connection with the second metal layer 320.

For example, the second solder pad 520 may have a multilayer structure of a titanium (Ti) layer 521 contacting the second metal layer 320 and a nickel (Ni) layer 522 disposed on the titanium (Ti) layer 521. In addition, the second solder pad 520 may have a multilayer structure including the titanium (Ti) layer 521 and a copper (Cu) layer disposed on the titanium (Ti) layer 521, instead of the nickel (Ni) layer 522.

The example embodiment shown in FIG. 12 is described as having a configuration in which the second solder pad 520 has a multilayer structure of titanium (Ti) and nickel (Ni), but the example embodiments are not limited thereto. For example, the second solder pad 520 may have a multilayer structure including a chromium (Cr) layer contacting the second metal layer 320 and a nickel (Ni) layer disposed on the chromium (Cr) layer or may have a multilayer structure including the chromium (Cr) layer and a copper (Cu) layer disposed on the chromium (Cr) layer.

The example embodiment shown in FIG. 12 is described as having a configuration in which the second solder pad 520 has a multilayer structure, but example embodiments are not limited thereto. For example, the second solder pad 520 may have a single layer structure including a nickel (Ni) layer or a copper (Cu) layer.

The second solder pad 520 may be formed by, for example, a process such as a sputtering process, an e-beam deposition process, or a plating process.

The intermetallic compound (IMC) 524 may be formed on the first surface 520a of the second solder pad 520. The intermetallic compound (IMC) 524 may be formed in a reflow process for forming the solder bump S. The intermetallic compound (IMC) 524 may be formed by reacting tin (Sn) components within solder with the metal of the second solder pad 520, for example, nickel (Ni), and may form an Sn—Ni binary system alloy.

The solder bump S may be bonded to the second solder pad 520 by using the intermetallic compound (IMC) 524. The solder bump S may be stably coupled to the second solder pad 520 by the intermetallic compound (IMC) 524 serving as a kind of adhesive.

The solder bump S may be formed by reflowing solder disposed on the second solder pad 520. The solder may be, for example, general SAC305 ($Sn_{96.5}Ag_{3.0}Cu_{0.5}$).

A barrier layer 523 may be formed to cover the second surface 520b of the second solder pad 520. The barrier layer 523 may significantly decrease wettability of the solder bump S and may block the intermetallic compound (IMC) 524 and the solder bump S from being diffused to the second surface 520b. This feature may be achieved by configuring a material of the barrier layer 523 to have a sufficiently low degree of wettability of the intermetallic compound (IMC) 524 and the solder bump S.

The barrier layer 523 may be an oxide film containing at least one of components of the second solder pad 520. For example, the barrier layer 523 may be an oxide film containing at least one element of nickel (Ni) and copper (Cu).

The barrier layer 523 may be formed by oxidizing the second surface 520b of the second solder pad 520 and, for example, may be formed by performing thermal oxidation or plasma oxidation to oxidize the second surface 520b of the UBM layer.

A manufacturing process of the semiconductor light emitting device of FIG. 1 will next be described. FIGS. 5A, 5B, 6A, 6B, 7A, 7B, 8A, 8B, 9A, 9B, 10A, 10B, 11A and 11B are views of respective main processes, illustrating a process of manufacturing the semiconductor light emitting device of FIG. 1. In FIG. 5a through FIG. 11B, the same reference numerals as in FIG. 1 through FIG. 4 designate the same elements and accordingly, a redundant description thereof will be omitted.

Figure 5A:
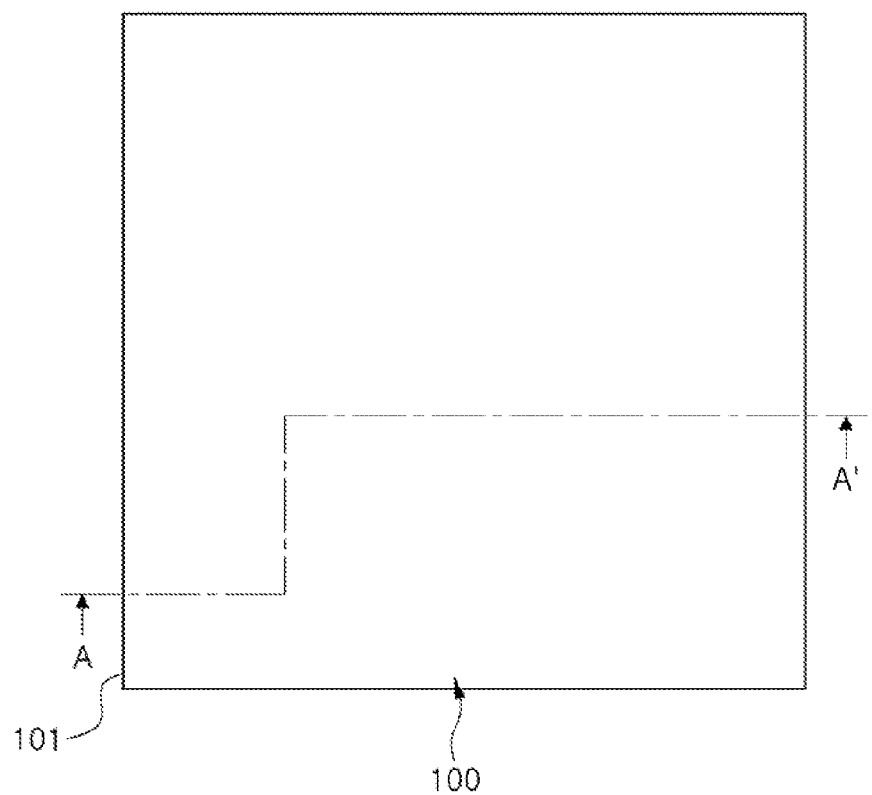
FIGS. 5A, 5B, 6A, 6B, 7A, 7B, 8A, 8B, 9A, 9B, 10A, 10B, 11A and 11B are views of respective main processes, illustrating a process of manufacturing the semiconductor light emitting device of FIG. 1.
Figure 5B:
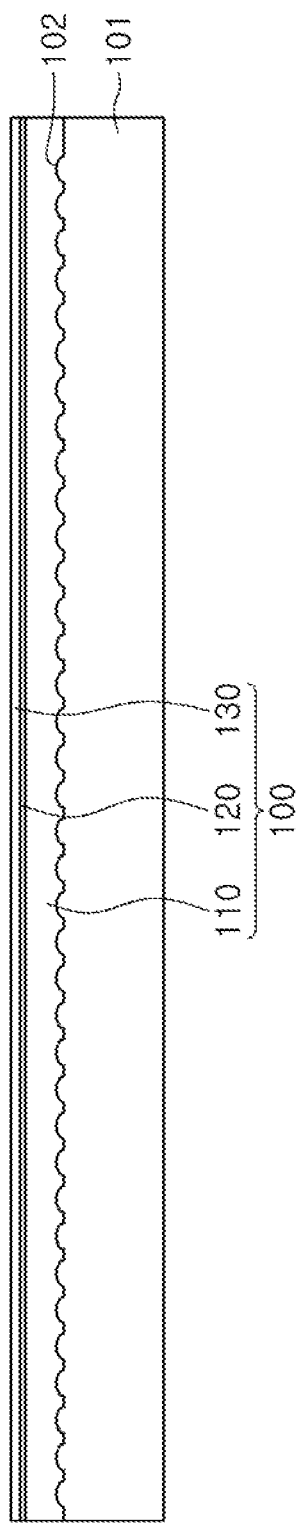

Referring to FIG. 5A and FIG. 5B, FIG. 5A is a plan view of the light emitting structure 100 formed on the substrate 101, and FIG. 5B is a cross-sectional view taken along line A-A' of FIG. 5A. Hereinafter, FIGS. 6A through 11B are illustrated in the same manner.

First, the unevenness structures 102 may be formed on the substrate 101, but depending on example embodiments, the unevenness structures 102 may be omitted. As described above, the substrate 101 may be formed of sapphire, Si, SiC, $MgAl_2O_4$, MgO, $LiAlO_2$, $LiGaO_2$, GaN, or the like.

Then, the light emitting structure 100 having a stack structure of a plurality of semiconductor layers may be formed by sequentially growing the first conductivity type semiconductor layer 110, the active layer 120, and the second conductivity type semiconductor layer 130 on the substrate 101, using a process such as metal organic chemical vapor deposition (MOCVD), hydride vapor phase epitaxy (HVPE), molecular beam epitaxy (MBE), or the like. According to an example embodiment, the first conductivity type semiconductor layer 110 and the second conductivity type semiconductor layer 130 may be an n-type semiconductor layer and a p-type semiconductor layer, respectively. In the light emitting structure 100, positions of the first conductivity type semiconductor layer 110 and the second conductivity type semiconductor layer 130 may be changed, in which case the second conductivity type semiconductor layer 130 may be first formed on the substrate 101.

Figure 6A:
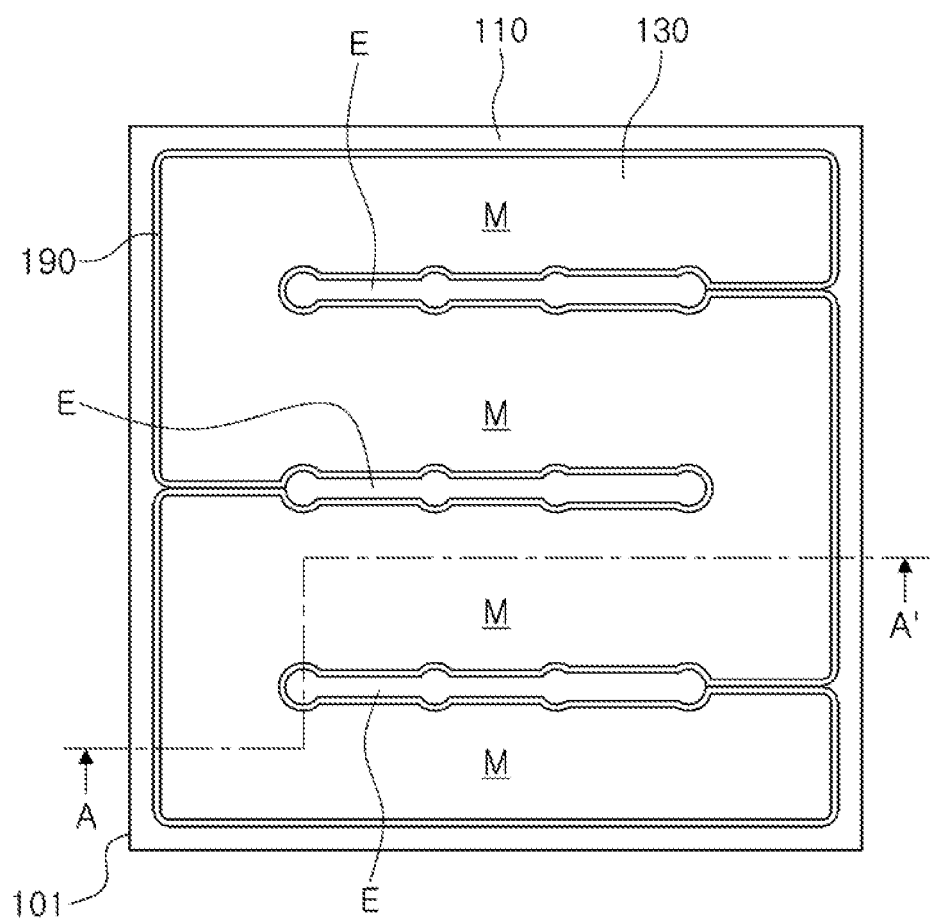
Figure 6B:
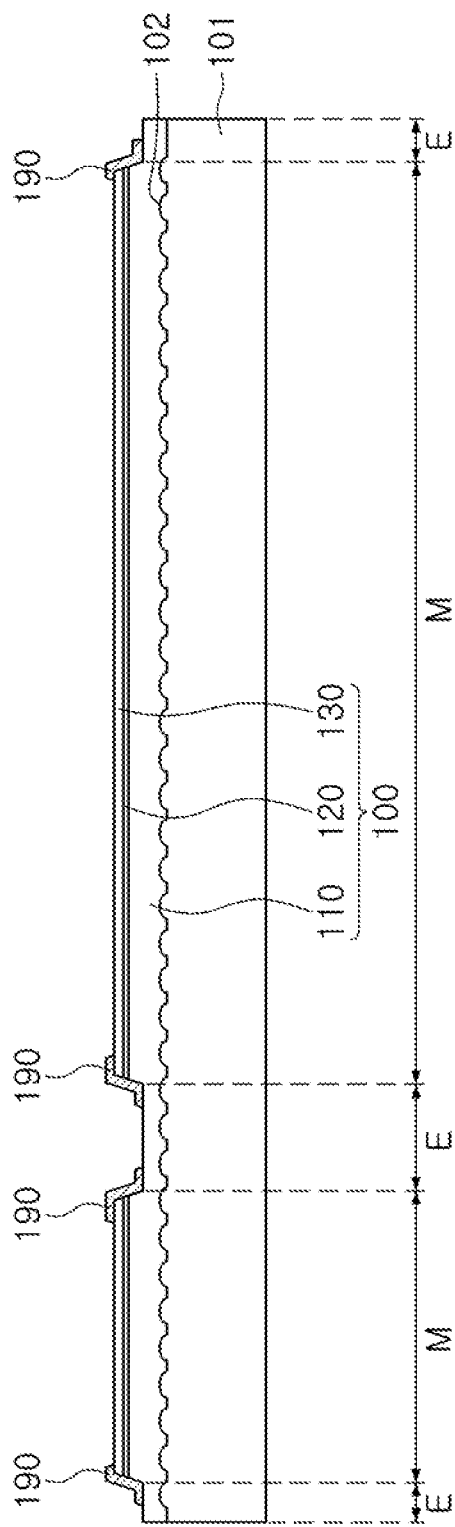

Referring to FIG. 6A and FIG. 6B, the second conductivity type semiconductor layer 130, the active layer 120, and the first conductivity type semiconductor layer 110 are partially etched in order to expose at least a portion of the first conductivity type semiconductor layer 110, such that the etched region E and the plurality of mesa regions M partially divided by the etched region E may be formed.

In an etching process, after forming a mask layer on a region except for an exposed region to which the first conductivity type semiconductor layer 110 is exposed, a wet process or dry process may be performed thereon to form the mesa regions M. Depending on example embodiments, the etching process may be performed such that only an upper surface of the first conductivity type semiconductor layer 110 may be partially exposed without etching the first conductivity type semiconductor layer 110.

The first insulating layer 190 may be formed on the side surface of each mesa region M exposed to the etched region E by the etching process. The first insulating layer 190 may be formed to cover an edge of an upper surface of the mesa region M, a portion of a bottom surface of the etched region E, and the side surface of the mesa region M. Thus, the active layer 120 exposed by the etched region E may be covered by the first insulating layer 190 so that the active layer 120 is not exposed outwardly. However, the first insulating layer 190 is selectively formed and depending on example embodiments, may be omitted.

Figure 7A:
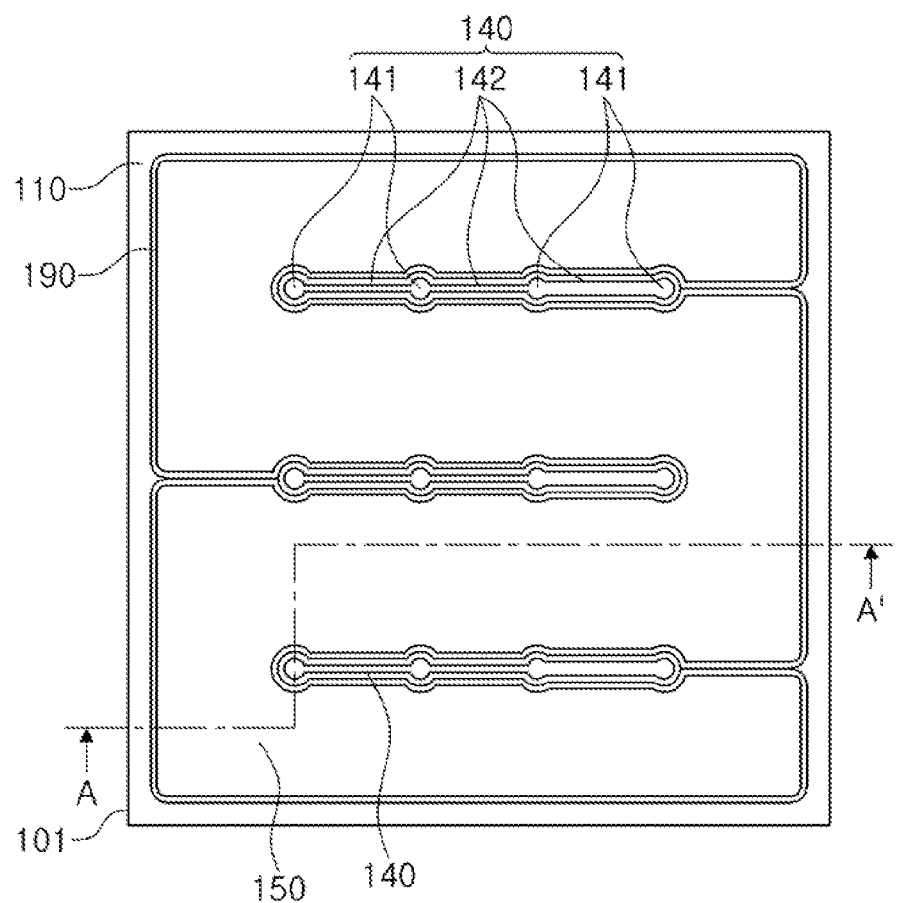
Figure 7B:
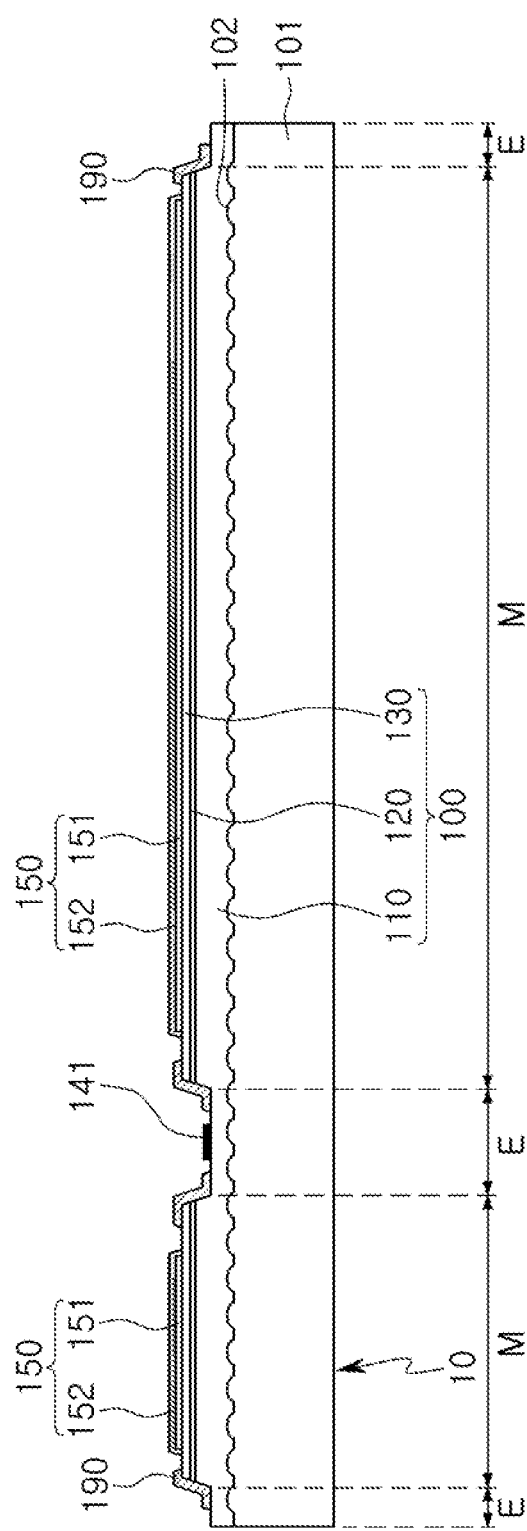

Referring to FIG. 7A and FIG. 7B, the first electrode 140 and the second electrode 150 may be formed on the etched region E and the mesa region M, respectively. The first electrode 140 may be extended along the etched region E and may be connected to the first conductivity type semiconductor layer 110 defining the bottom surface of the etched region E. The second electrode 150 may be connected to the second conductivity type semiconductor layer 130.

The first electrode 140 may be configured to include the plurality of pad portions 141 and the plurality of finger portions 142 extended from the plurality of pad portions 141. The second electrode 150 may include the reflective metal layer 151 and may further include the coating metal layer 152 covering the reflective metal layer 151. By forming the first electrode 140 and the second electrode 150 as described above, the light emitting diode chip 10 is prepared.

Figure 8A:
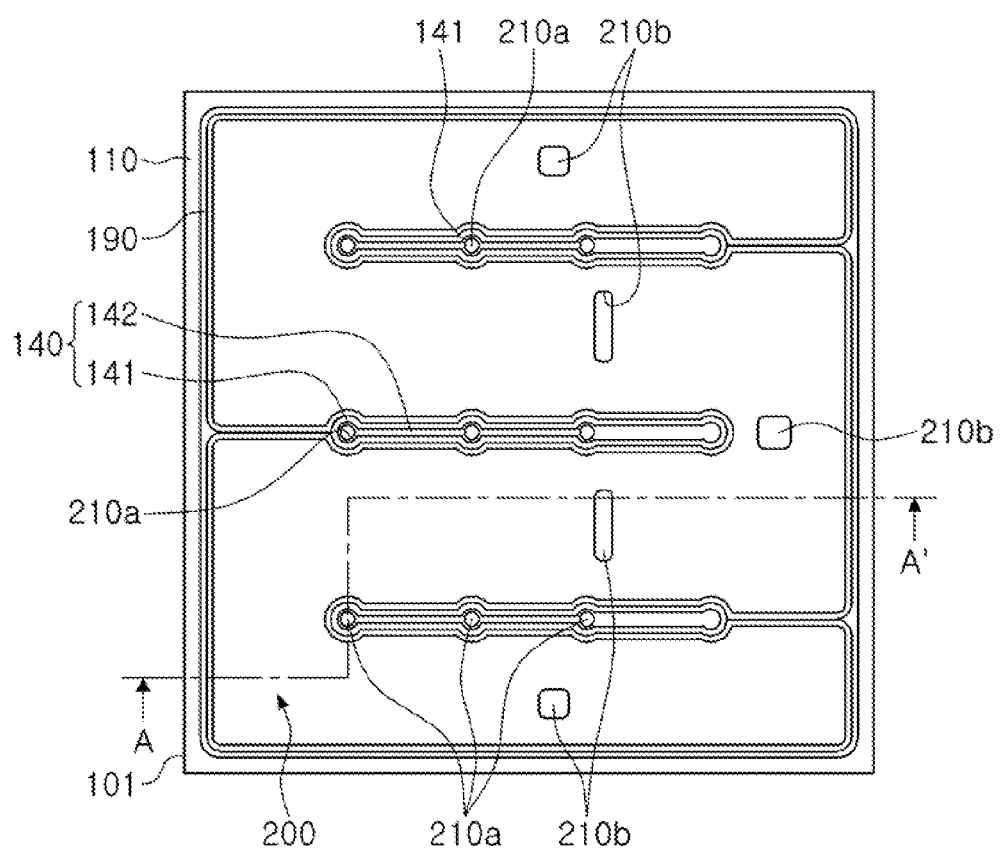
Figure 8B:
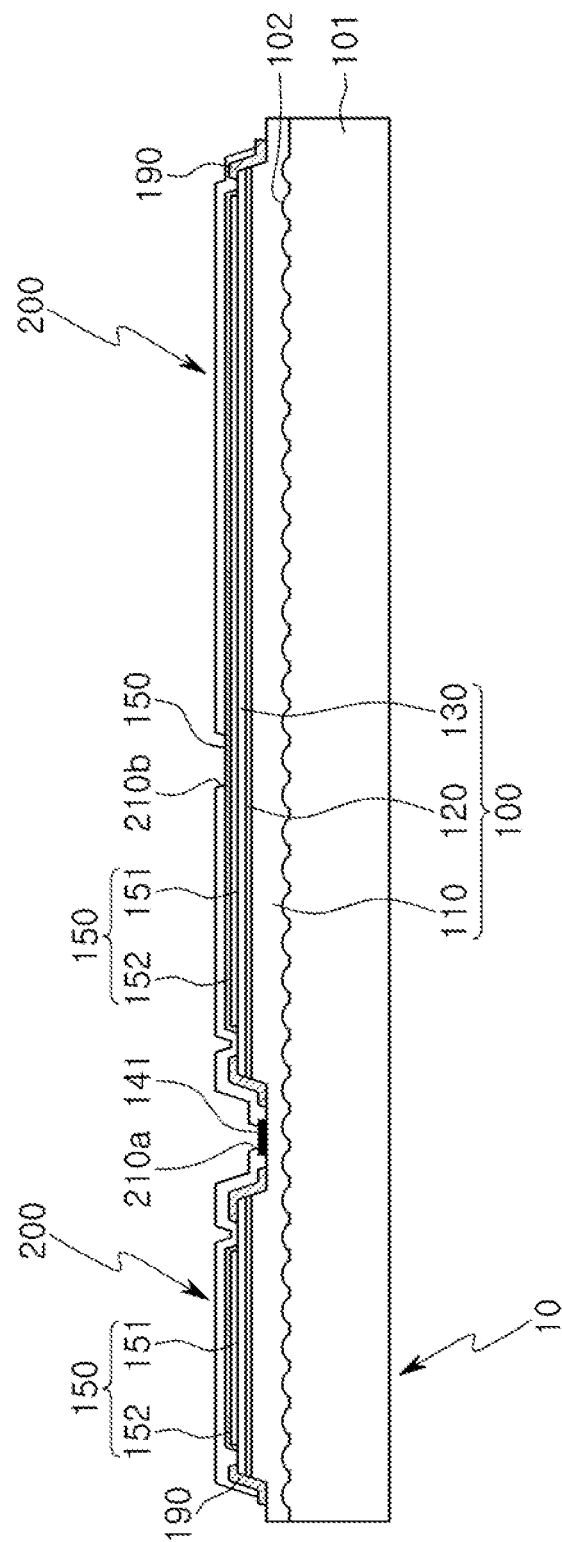

Referring to FIG. 8A and FIG. 8B, the second insulating layer 200 may be provided to cover a surface of the light emitting diode chip 10. For example, the second insulating layer 200 may be formed of an epoxy-based insulating resin. In addition, the second insulating layer 200 may be formed to contain $SiO_2$, $SiO_xN_y$, $TiO_2$, $Al_2O_3$, $ZrO_2$ or the like.

The first electrode 140 and the second electrode 150 may be partially exposed through the plurality of openings 210a and 210b on the first and second conductivity type semiconductor layers 110 and 130. The plurality of openings 210 may be formed by dry etching such as inductively coupled plasma-reactive ion etching (ICP-RIE). Through the dry etching process, the exposed surfaces of the first and second electrodes 140 and 150 may be contaminated with oxides formed due to dry etching, and thus, a degree of reflectivity may be lowered and a level of the forward voltage may be increased.

Figure 9A:
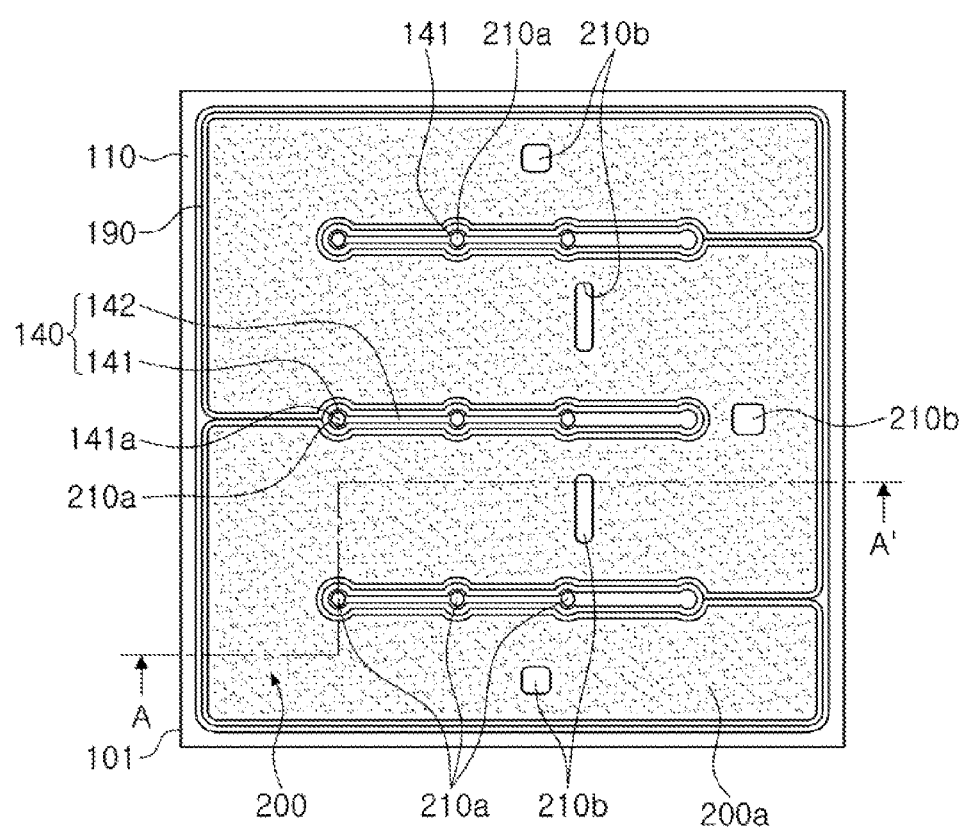
Figure 9B:
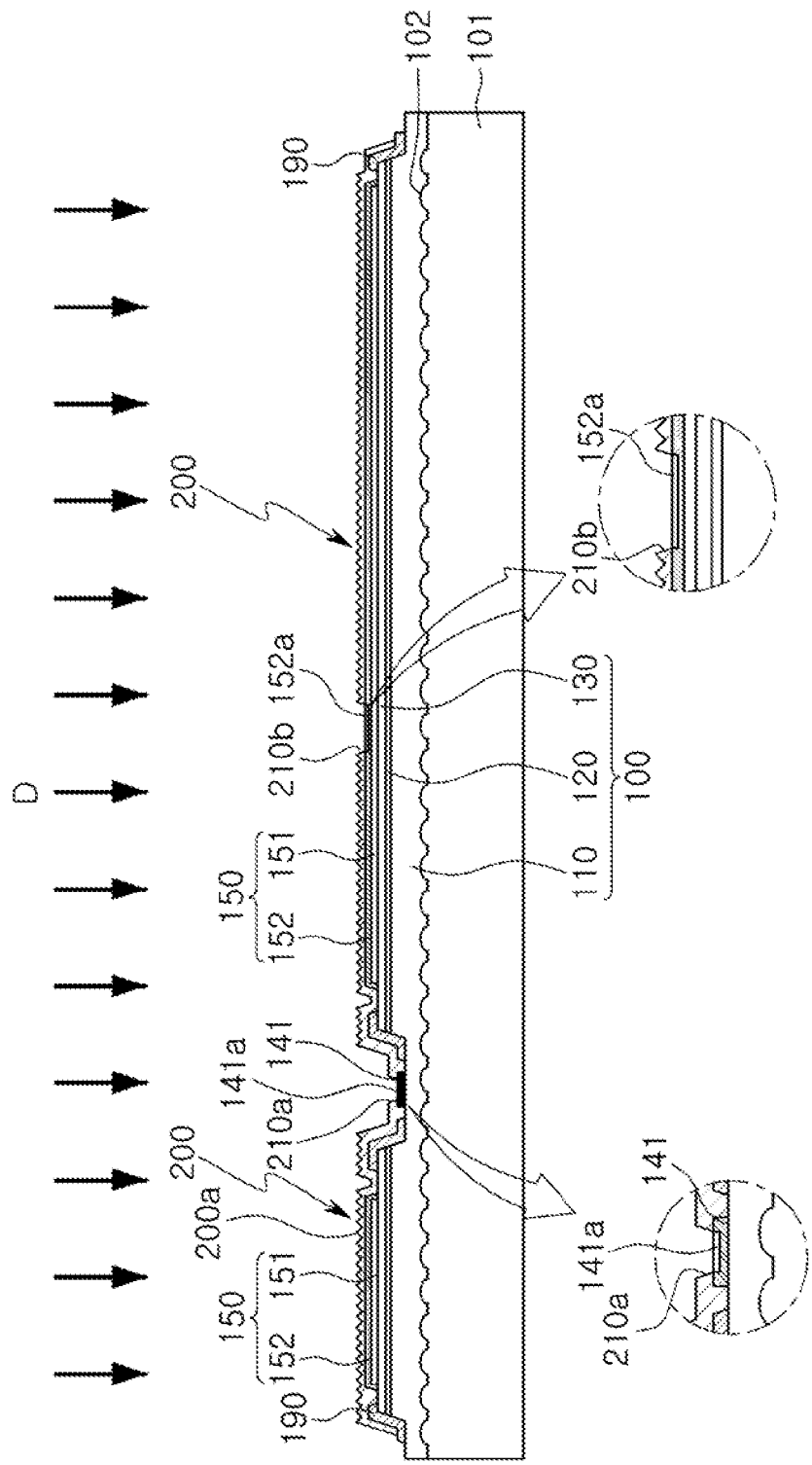

Referring to FIG. 9A and FIG. 9B, a plasma treatment is performed in a direction D in which the second insulating layer 200 is exposed, to form the unevenness portion 200a on the surface of the second insulating layer 200, and the oxygen-depleted layers 141a and 152a may be formed in exposed regions of the first and second electrodes 140 and 150 exposed by the first and second openings 210a and 210b. The plasma treatment may, for example, be an Ar plasma treatment or an $H_2$ plasma treatment. The plasma treatment may be repeatedly performed. In the case that the plasma treatment is performed multiple times, an $O_2$-plasma treatment process may be included in the plasma treatment, but as a final plasma treatment process, it may be preferable to perform an Ar plasma treatment or an $H_2$ plasma treatment. In this manner, the unevenness portion 200a of the second insulating layer 200 and the oxygen-depleted layers 141a and 152a may be performed in a single process. Thus, the time required for the application of the process may be decreased, as compared to the case of forming the oxygen-depleted layers 141a and 152a and the unevenness portion 200a through separate processes.

Figure 10A:
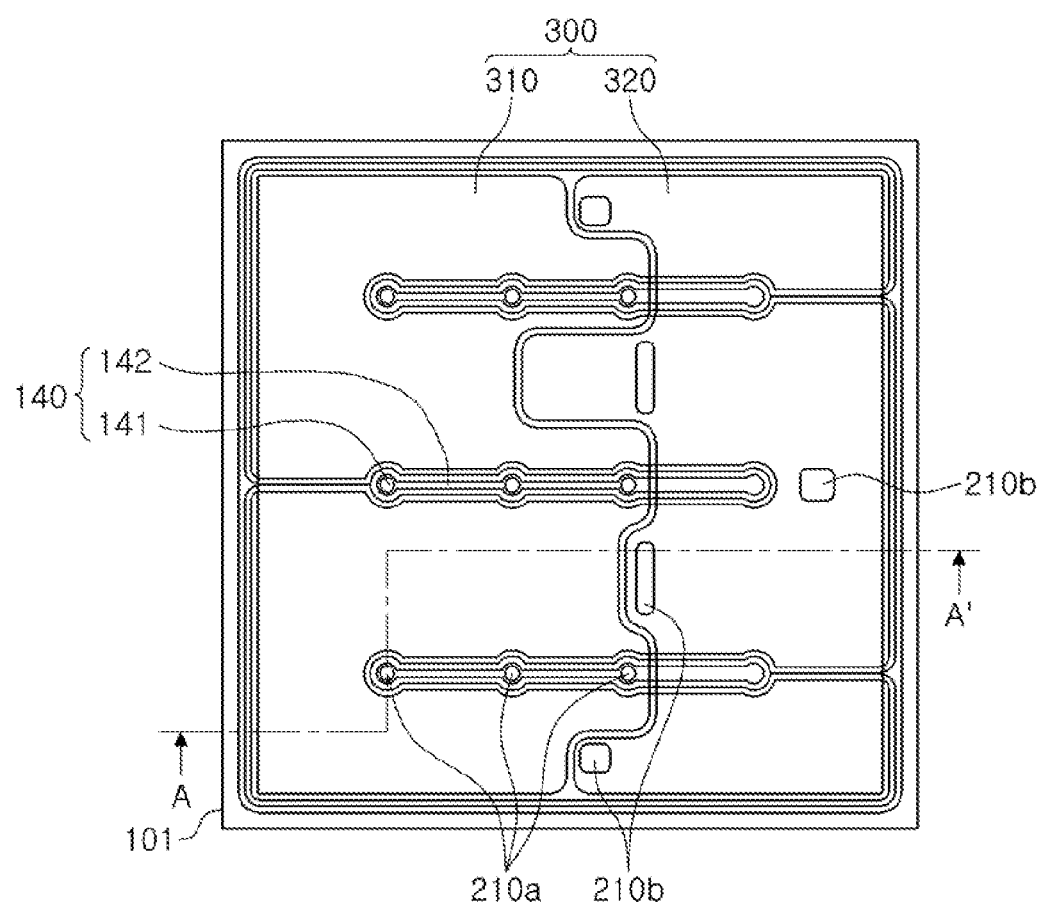
Figure 10B:
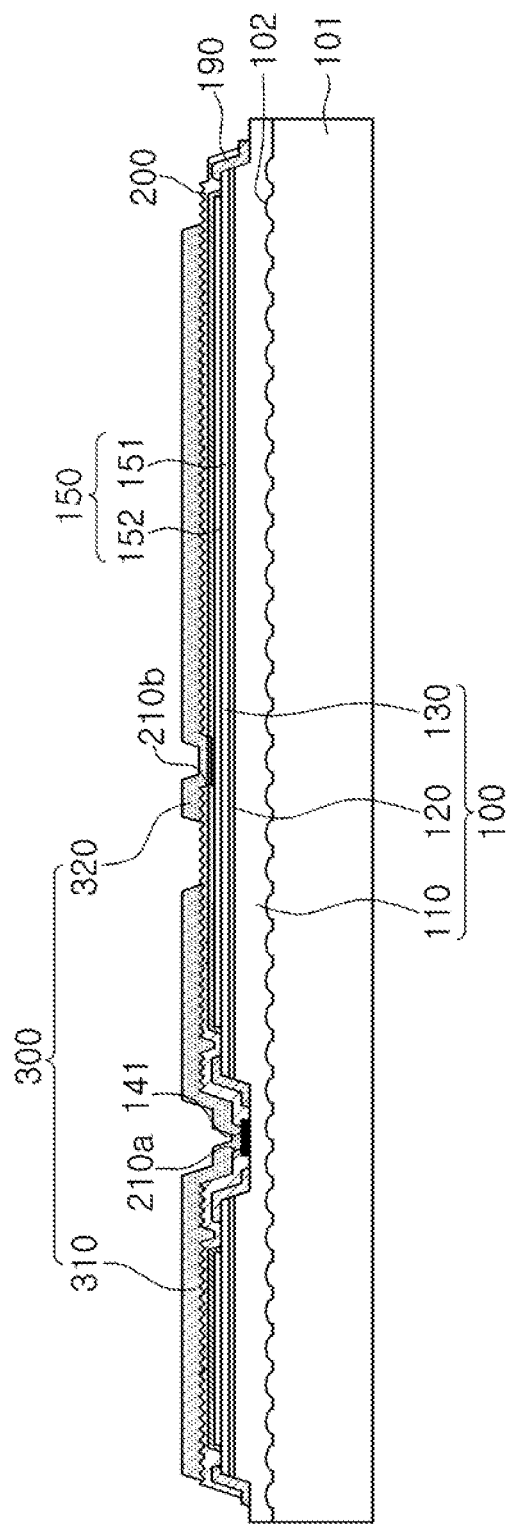

Referring to FIG. 10A and FIG. 10B, the electrode pad 300 may be provided on the second insulating layer 200 and may be connected to the first and second electrodes 140 and 150 exposed through the openings 210a and 210b to be electrically connected to the first conductivity type semiconductor layer 110 and the second conductivity type semiconductor layer 130, respectively.

The electrode pad 300 may be provided in at least one pair for electrical insulation between the first conductivity type semiconductor layer 110 and the second conductivity type semiconductor layer 130. That is, the first metal layer 310 may be electrically connected to the first conductivity type semiconductor layer 110 through the first electrode 140 and the second metal layer 320 may be electrically connected to the second conductivity type semiconductor layer 130 through the second electrode 150. The first and second metal layers 310 and 320 may be separated and electrically insulated from each other.

Figure 11A:
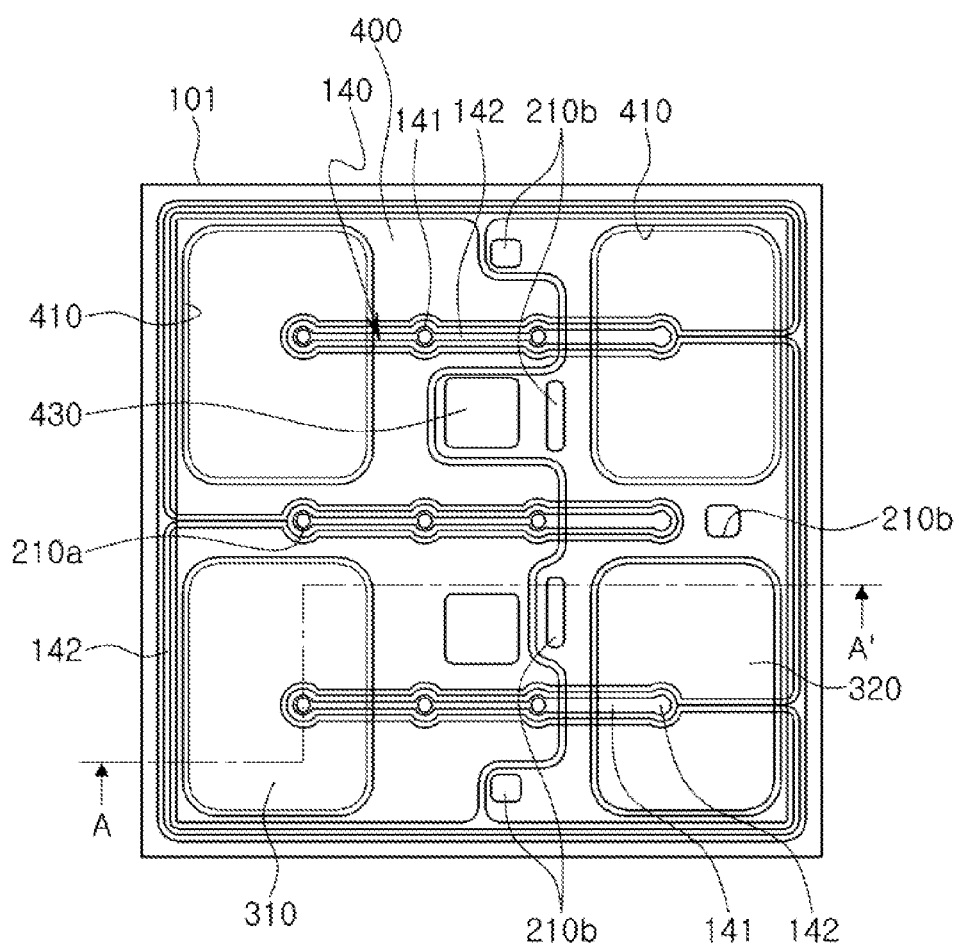
Figure 11B:
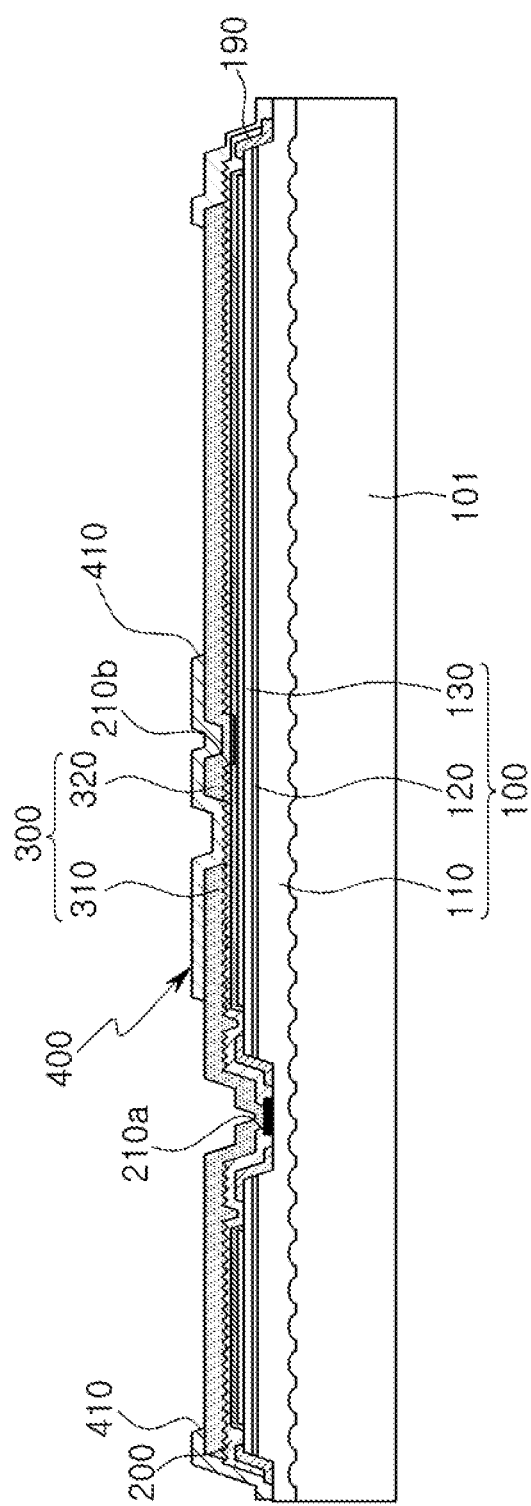

Referring to FIG. 11A and FIG. 11B, the passivation layer 400 may be provided on the electrode pad 300 and may partially expose the electrode pad 300 through the bonding region 410.

The bonding region 410 may be provided as a plurality of bonding regions 410 to partially expose the first metal layer 310 and the second metal layer 320, respectively. In this case, a portion of the plurality of bonding regions 410 may be disposed not to overlap with a portion of the plurality of openings 210a and 210b of the second insulating layer 200. For example, as illustrated in FIG. 11B, the bonding region 410 partially exposing the second metal layer 320 among the plurality of bonding regions 410 may not overlap with the opening 210b partially exposing the second electrode 150 among the plurality of openings 210a and 210b. That is, the bonding region 410 may not be positioned above the opening 210b in a vertical direction of FIG. 11B.

The passivation layer 400 may be formed of a material that is the same as a material of the second insulating layer 200. The passivation layer 400 may further include the open regions 430 partially exposing the first and second metal layers 310 and 320, similar to the bonding regions 410. The open regions 430 may be provided to confirm whether or not an operation of a manufactured semiconductor light emitting device is performed before the semiconductor light emitting device is shipped as a product. A probe pin may be connected to the first and second metal layers 310 and 320 exposed by the open regions 430 to supply the semiconductor light emitting device with driving power, whereby the operation of the semiconductor light emitting device may be confirmed.

Meanwhile, as illustrated in FIG. 2, the solder pads 500 including the first solder pad 510 and the second solder pad 520 may be formed on the first and second metal layers 310 and 320 partially exposed through the bonding regions 410. The first solder pad 510 and the second solder pad 520 may be, for example, under bump metallurgy (UBM) layers. The number and arrangement structures of the first solder pad 510 and the second solder pad 520 are not limited to those depicted in the drawings and may be modified in various ways as described above.

Figure 13:
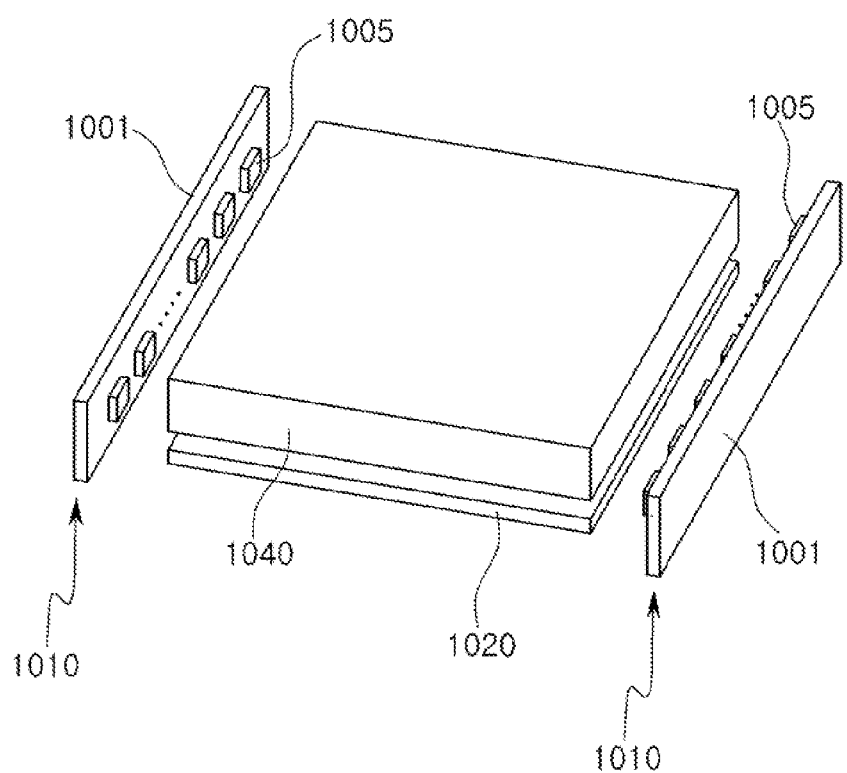
FIG. 13 is a perspective view, illustrating an example of applying the semiconductor light emitting device according to an example embodiment to a backlight unit.

FIG. 13 is a perspective view illustrating an example of applying the semiconductor light emitting device according to an example embodiment to a backlight unit.

Referring to FIG. 13, a backlight unit 1000 may include a light guide plate 1040 and light source modules 1010 provided on both sides of the light guide plate 1040. Also, the backlight unit 1000 may further include a reflective plate 1020 disposed below the light guide plate 1040. The backlight unit 1000 according to an example embodiment may be an edge type backlight unit.

According to an example embodiment, the light source module 1010 may only be provided on one side of the light guide plate 1040 or may further be provided on the other side thereof. The light source module 1010 may include a printed circuit board (PCB) 1001 and a plurality of light sources 1005 mounted on an upper surface of the PCB 1001.

Figure 14:
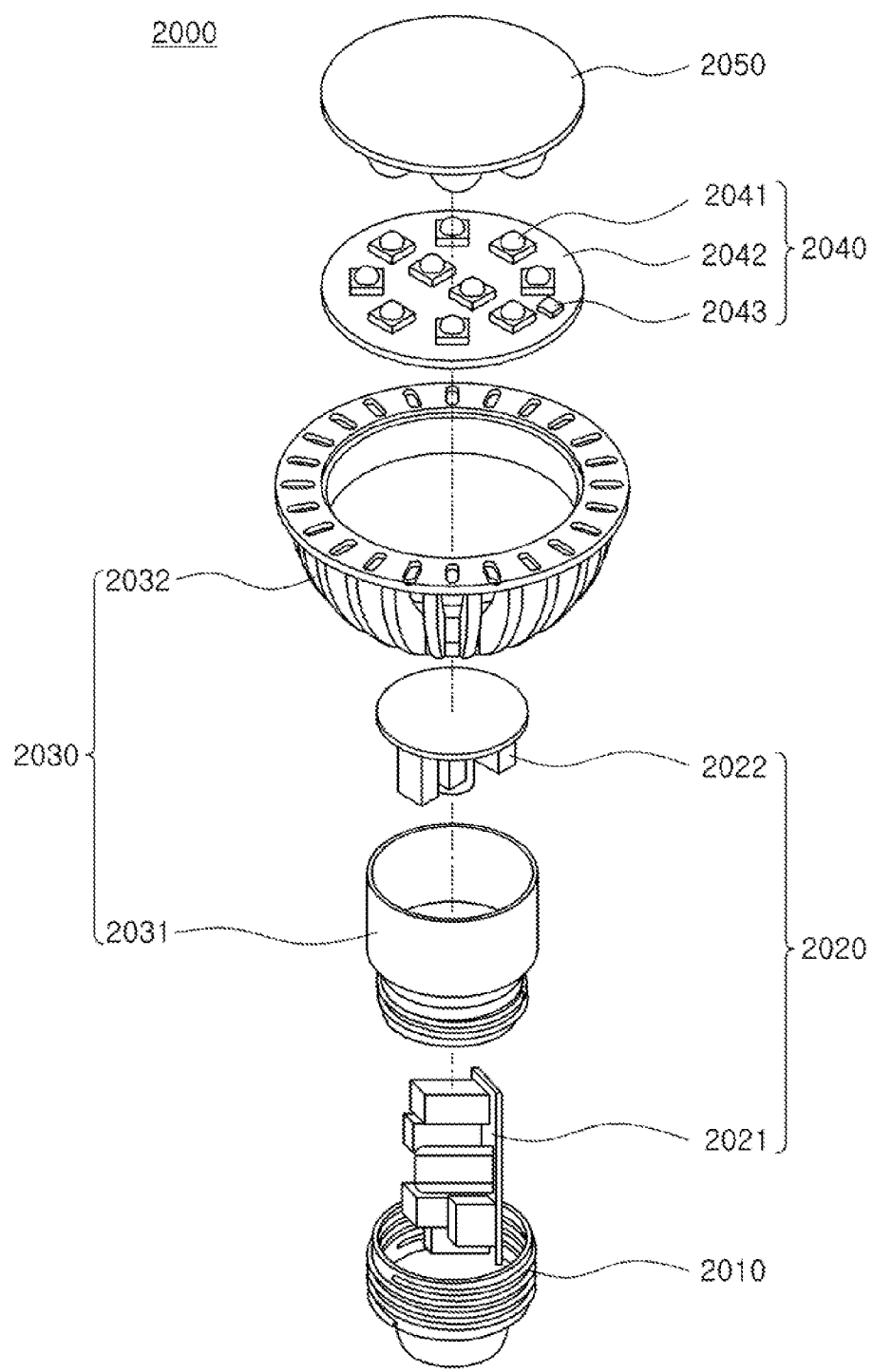
FIG. 14 and FIG. 15 are views, each illustrating an example of applying the semiconductor light emitting device according to an example embodiment to a lighting device.

FIG. 14 is an exploded perspective view schematically illustrating a bulb type lamp as a lighting device employing the semiconductor light emitting device according to an example embodiment.

Referring to FIG. 14, a lighting device 2000 may include a socket 2010, a power source unit 2020 (e.g., power source), a heat dissipation unit 2030 (e.g., heat dissipator), a light source module 2040, and an optical unit 2050. According to an example embodiment, the light source module 2040 may include a light emitting device array, and the power source unit 2020 may include a light emitting device driving unit.

The socket 2010 may be configured to be replaced with an existing lighting device. Power supplied to the lighting device 2000 may be applied through the socket 2010. As illustrated, the power source unit 2020 may include a first power source unit 2021 (e.g., first power source) and a second power source unit 2022 (e.g., second power source). The first power source unit 2021 and the second power source unit 2022 may be separately provided and assembled to form the power source unit 2020. The heat dissipation unit 2030 may include an internal heat dissipation unit 2031 (e.g., internal heat dissipator) and an external heat dissipation unit 2032 (e.g., external heat dissipator). The internal heat dissipation unit 2031 may be directly connected to the light source module 2040 and/or the power source unit 2020 to thereby transmit heat to the external heat dissipation unit 2032.

The light source module 2040 may emit light to the optical unit 2050 upon receiving power from the power source unit 2020. The light source module 2040 may include one or more light emitting devices 2041, a circuit board 2042, and a controller 2043. The controller 2043 may store driving information of the light emitting devices 2041.

Figure 15:
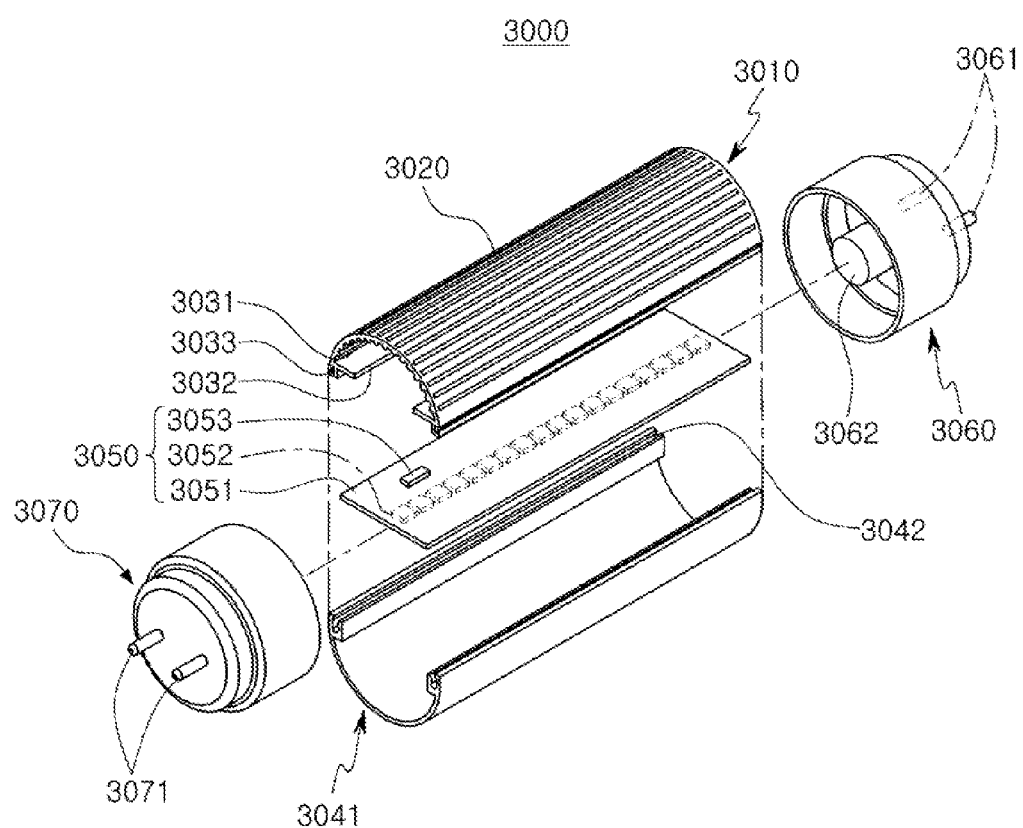

FIG. 15 is an exploded perspective view schematically illustrating a bar type lamp as a lighting device employing the semiconductor light emitting device according to an example embodiment.

In detail, a lighting device 3000 includes a heat dissipation member 3010, a cover 3041, a light source module 3050, a first socket 3060, and a second socket 3070. A plurality of heat dissipation fins 3020 and 3031 may be formed in a concavo-convex pattern on an internal surface of the heat dissipation member 3010, an external surface of the heat dissipation member 3010, or a combination thereof, and the heat dissipation fins 3020 and 3031 may be designed to have various shapes and intervals (spaces) therebetween. A support 3032 having a protruded shape may be formed on an inner side of the heat dissipation member 3010. The light source module 3050 may be fixed to the support 3032. Stoppage protrusions 3033 may be formed on both ends of the heat dissipation member 3010.

The stoppage recesses 3042 may be formed in the cover 3041, and the stoppage protrusions 3033 of the heat dissipation member 3010 may be coupled to the stoppage recesses 3042. The positions of the stoppage recesses 3042 and the stoppage protrusions 3033 may be interchanged.

The light source module 3050 may include a light emitting device array. The light source module 3050 may include a PCB 3051, a light source 3052, and a controller 3053. As described above, the controller 3053 may store driving information of the light source 3052. Circuit wirings are formed on the PCB 3051 to operate the light source 3052. Also, components for operating the light source 3052 may be provided.

The first and second sockets 3060 and 3070, a pair of sockets, are respectively coupled to opposing ends of the cylindrical cover unit including the heat dissipation member 3010 and the cover 3041. For example, the first socket 3060 may include electrode terminals 3061 and a power source device 3062, and dummy terminals 3071 may be disposed on the second socket 3070. Also, an optical sensor and/or a communications module may be installed in either the first socket 3060 or the second socket 3070. For example, the optical sensor, the communications module, or a combination thereof may be installed in the second socket 3070 in which the dummy terminals 3071 are disposed. In another example, the optical sensor and/or the communications module may be installed in the first socket 3060 in which the electrode terminals 3061 are disposed.

As set forth above, according to example embodiments, a semiconductor light emitting device may be provided in which an adhesive layer for depositing an electrode pad may be omitted and a driving voltage is decreased.

While example embodiments have been shown and described above, it will be apparent to those skilled in the art that modifications and variations could be made without departing from the scope of the example embodiments as defined by the appended claims.

What is claimed is:

1. A method of manufacturing a semiconductor light emitting device, the method comprising:
    stacking a light emitting structure comprising a first conductivity type semiconductor layer, an active layer, and a second conductivity type semiconductor layer on a substrate;
    forming a first electrode and a second electrode on the first conductivity type semiconductor layer and the second conductivity type semiconductor layer, respectively;
    forming an insulating layer covering the first and second electrodes and having first and second openings partially exposing surfaces of the first and second electrodes, respectively; and
    performing a plasma treatment on a surface of the insulating layer and the partially exposed surfaces of the first and second electrodes to form an unevenness portion on the surface of the insulating layer and form an oxygen-depleted layer on the partially exposed surfaces of the first and second electrodes.

2. The method of claim 1, wherein the plasma treatment is an Argon (Ar) plasma treatment or an $H_2$ plasma treatment.

3. The method of claim 1, wherein the surface of the insulating layer has a root mean square (RMS) roughness of at least 5 Å.

4. The method of claim 1, further comprising:
    forming an electrode pad covering a region of the insulating layer and the oxygen-depleted layer.

5. The method of claim 4, wherein the forming of the electrode pad comprises forming the electrode pad by stacking metal layers.

6. The method of claim 5, wherein a selected metal layer among the metal layers is formed of a material comprising one or more of aluminum (Al), silver (Ag), or an alloy of Al or Ag.

7. The method of claim 6, further comprising providing the electrode pad such that the electrode pad contacts the oxygen-depleted layer.

8. The method of claim 7, further comprising providing the selected metal layer such that the selected metal layer contacts the oxygen-depleted layer.

9. The method of claim 4, further comprising:
    providing an under bump metallurgy (UBM) layer on the electrode pad.

10. The method of claim 1, wherein the insulating layer comprises a material selected from a group consisting of $SiO_2$, $SiO_xN_y$, $TiO_2$, $Al_2O_3$, $ZrO_2$ and combinations thereof.

11. A method of manufacturing a semiconductor light emitting device, the method comprising:
    stacking a light emitting structure comprising a first conductivity type semiconductor layer, an active layer, and a second conductivity type semiconductor layer on a substrate;
    forming a first electrode and a second electrode on the first conductivity type semiconductor layer and the second conductivity type semiconductor layer, respectively;
    forming an insulating layer covering the first and second electrodes and having first and second openings partially exposing surfaces of the first and second electrodes, respectively; and
    performing a plasma treatment on a surface of the insulating layer and the partially exposed surfaces of the first and second electrodes, in a single process.

12. The method of claim 11, wherein, the performing of the plasma treatment comprises performing the plasma treatment on the surface of the insulating layer and the partially exposed surfaces of the first and second electrodes multiple times.

13. The method of claim 12, wherein the performing of the plasma treatment multiple times comprises performing an Ar (Argon) plasma treatment or an $H_2$ plasma treatment as a final plasma treatment among the multiple-performed plasma treatments.

14. The method of claim 11, wherein the performing of the plasma treatment on the surface of the insulating layer and the partially exposed surfaces of the first and second electrodes further comprises:
    providing a mask layer exposing the surfaces of the first and second electrodes and covering a portion of the surface of the insulating layer while performing the plasma treatment.

15. The method of claim 11, further comprising using a dry etching process to form the first and second openings.

16. A method of manufacturing a light emitting device, comprising:
    forming an insulating layer partially covering first and second electrodes stacked on a substrate, thereby leaving uncovered portions of the first and second electrodes; and
    performing a single plasma treatment which simultaneously modifies a surface of the insulating layer and forms an oxygen-depleted layer on the uncovered portions.

17. The method of claim 16, wherein the performing of the single plasma treatment comprises modifying the surface of the insulating layer to have an uneven surface shape.

18. The method of claim 17, wherein the performing of the single plasma treatment comprises modifying the surface of the insulating layer to have dome-shaped protrusions.

19. The method of claim 16, further comprising:
    forming an electrode pad on the insulating layer,
    wherein the performing of the single plasma treatment comprises modifying the surface of the insulating layer to increase a surface area of the insulating layer which contacts the electrode pad.

* * * * *